United States Patent
Halbritter et al.

(10) Patent No.: US 12,261,256 B2
(45) Date of Patent: Mar. 25, 2025

(54) OPTOELECTRONIC COMPONENT, OPTOELECTRONIC ARRANGEMENT AND METHOD

(71) Applicant: OSRAM Opto Semiconductors GmbH, Regensburg (DE)

(72) Inventors: Hubert Halbritter, Dietfurt Toeging (DE); Erwin Lang, Regensburg (DE); Julia Stolz, Regensburg (DE); Andreas Rausch, Tegernheim (DE); Simon Schwalenberg, Brennberg, CA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 716 days.

(21) Appl. No.: 17/430,254

(22) PCT Filed: Feb. 11, 2020

(86) PCT No.: PCT/EP2020/053498
§ 371 (c)(1),
(2) Date: Aug. 11, 2021

(87) PCT Pub. No.: WO2020/165185
PCT Pub. Date: Aug. 20, 2020

(65) Prior Publication Data
US 2022/0140210 A1    May 5, 2022

(30) Foreign Application Priority Data

Feb. 11, 2019  (DE) ...................... 10 2019 103 365.9
Apr. 23, 2019  (DE) ...................... 10 2019 110 499.8

(Continued)

(51) Int. Cl.
    *H01L 33/50*  (2010.01)
    *H01L 33/60*  (2010.01)
(52) U.S. Cl.
    CPC .............. *H01L 33/60* (2013.01); *H01L 33/50* (2013.01)
(58) Field of Classification Search
    CPC .............................. H01L 33/60; H01L 33/50
    See application file for complete search history.

(56) References Cited

U.S. PATENT DOCUMENTS

| 4,897,614 A | 1/1990 | Nishio |
| 4,979,002 A | 12/1990 | Pankove |

(Continued)

FOREIGN PATENT DOCUMENTS

| DE | 19744793 A1 | 4/1998 |
| DE | 19751649 A1 | 5/1999 |

(Continued)

OTHER PUBLICATIONS

Volz et al., "Influence of annealing on the optical and structural properties of dilute N-containing III/V semiconductor heterostructures," Journal of Crystal Growth, Jan. 2007, vol. 298, pp. 126-130.

(Continued)

*Primary Examiner* — Dale E Page
*Assistant Examiner* — Wilner Jean Baptiste
(74) *Attorney, Agent, or Firm* — ArentFox Schiff LLP

(57) ABSTRACT

The invention relates to various aspects of an optoelectronic component or an arrangement comprising such a component for various applications, in particular in the automotive sector and for visual displays. The arrangements are characterized by simple manufacture and fast switching times.

25 Claims, 16 Drawing Sheets

(30) Foreign Application Priority Data

May 7, 2019 (DE) .................. 10 2019 111 767.4
Jan. 29, 2020 (WO) ............... PCT/EP2020/052191

(56) References Cited

U.S. PATENT DOCUMENTS

| | | |
|---|---|---|
| 5,103,271 A | 4/1992 | Izumiya et al. |
| 5,537,171 A | 7/1996 | Ogino et al. |
| 5,858,814 A | 1/1999 | Goossen et al. |
| 6,048,751 A | 4/2000 | D'Asaro et al. |
| 6,316,286 B1 | 11/2001 | Trezza |
| 6,527,456 B1 | 3/2003 | Trezza |
| 6,881,982 B2 | 4/2005 | Okuyama et al. |
| 7,067,339 B2 | 6/2006 | Biwa et al. |
| 7,808,005 B1 | 10/2010 | Fattal et al. |
| 8,049,233 B2 | 11/2011 | Fukshima et al. |
| 8,349,116 B1 | 1/2013 | Bibl et al. |
| 8,586,965 B2 | 11/2013 | Toyoda et al. |
| 8,816,324 B2 | 8/2014 | Fukui et al. |
| 9,202,988 B2 | 12/2015 | Yoshida et al. |
| 9,318,645 B2 | 4/2016 | Tani et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,520,537 B2 | 12/2016 | Bower et al. |
| 9,698,308 B2 | 7/2017 | Bower et al. |
| 9,705,042 B2 | 7/2017 | Bower et al. |
| 9,923,013 B1 | 3/2018 | Yamashita et al. |
| 9,991,423 B2 | 6/2018 | Bower et al. |
| 9,997,102 B2 | 6/2018 | Rotzoll et al. |
| 10,069,036 B2 | 9/2018 | Atanackovic |
| 10,096,585 B2 | 10/2018 | Tanaka et al. |
| 10,147,849 B2 | 12/2018 | Xu et al. |
| 10,177,195 B2 | 1/2019 | Ahmed et al. |
| 10,224,460 B2 | 3/2019 | Bower et al. |
| 10,395,589 B1 | 8/2019 | Vahid Far et al. |
| 10,396,241 B1 | 8/2019 | Perkins |
| 10,405,406 B2 | 9/2019 | Liszt |
| 10,418,517 B2 | 9/2019 | Atanackovic |
| 10,446,719 B2 | 10/2019 | Bower et al. |
| 10,490,695 B2 | 11/2019 | Gomez-Iglesias et al. |
| 10,522,787 B1 | 12/2019 | Montgomery et al. |
| 10,622,514 B1 | 4/2020 | Atanackovic |
| 10,802,334 B2 | 10/2020 | Kim et al. |
| 10,833,225 B2 | 11/2020 | Bower et al. |
| 10,903,193 B2 | 1/2021 | Yamada |
| 10,963,103 B1 | 3/2021 | Shahmohammadi |
| 10,985,143 B2 | 4/2021 | Bower et al. |
| 11,156,759 B2 | 10/2021 | Brick et al. |
| 11,367,807 B2 | 6/2022 | Wada et al. |
| 11,513,275 B2 | 11/2022 | Brick et al. |
| 11,538,852 B2 | 12/2022 | Varghese et al. |
| 11,552,057 B2 | 1/2023 | Chae et al. |
| 2002/0072138 A1 | 6/2002 | Trezza et al. |
| 2002/0074553 A1 | 6/2002 | Starikov et al. |
| 2003/0013230 A1 | 1/2003 | Dudoff et al. |
| 2003/0141507 A1 | 7/2003 | Krames et al. |
| 2003/0168666 A1 | 9/2003 | Okuyama et al. |
| 2003/0189125 A1 | 10/2003 | Trierenberg |
| 2005/0194598 A1 | 9/2005 | Kim et al. |
| 2005/0237488 A1 | 10/2005 | Yamasaki et al. |
| 2005/0264472 A1 | 12/2005 | Rast |
| 2006/0043402 A1 | 3/2006 | Suehiro et al. |
| 2006/0192225 A1 | 8/2006 | Chua et al. |
| 2007/0057249 A1 | 3/2007 | Kim et al. |
| 2007/0096127 A1 | 5/2007 | Pattison et al. |
| 2008/0061304 A1 | 3/2008 | Huang et al. |
| 2008/0160725 A1 | 7/2008 | Byun et al. |
| 2009/0045416 A1 | 2/2009 | Bierhuizen et al. |
| 2009/0291237 A1 | 11/2009 | Park et al. |
| 2009/0296754 A1* | 12/2009 | Ledentsov ............ H01S 5/0601 257/E31.127 |
| 2009/0315054 A1 | 12/2009 | Kim et al. |
| 2010/0019693 A1 | 1/2010 | Hoogzaad et al. |
| 2010/0019697 A1 | 1/2010 | Korsunsky et al. |
| 2010/0163894 A1 | 7/2010 | Uemura et al. |
| 2010/0252103 A1 | 10/2010 | Yao et al. |
| 2010/0317132 A1 | 12/2010 | Rogers et al. |
| 2011/0151602 A1 | 6/2011 | Speier |
| 2011/0156070 A1 | 6/2011 | Yoon et al. |
| 2011/0204327 A1 | 8/2011 | Hiruma et al. |
| 2011/0254043 A1 | 10/2011 | Negishi et al. |
| 2011/0263054 A1 | 10/2011 | Yu et al. |
| 2012/0126229 A1 | 5/2012 | Bower |
| 2012/0223289 A1 | 9/2012 | Gwo et al. |
| 2012/0223873 A1 | 9/2012 | Ohta |
| 2013/0063815 A1 | 3/2013 | Kubota |
| 2013/0082624 A1 | 4/2013 | Brassfield et al. |
| 2013/0119424 A1 | 5/2013 | Kang et al. |
| 2013/0154498 A1 | 6/2013 | Missbach |
| 2013/0249972 A1 | 9/2013 | Nishino et al. |
| 2013/0328066 A1 | 12/2013 | Sabathil et al. |
| 2014/0008677 A1 | 1/2014 | Zhu et al. |
| 2014/0131753 A1 | 5/2014 | Ishida et al. |
| 2014/0159064 A1 | 6/2014 | Sakariya et al. |
| 2014/0319560 A1 | 10/2014 | Tischler |
| 2014/0340900 A1 | 11/2014 | Bathurst et al. |
| 2015/0103070 A1 | 4/2015 | In et al. |
| 2015/0103404 A1 | 4/2015 | Rudy et al. |
| 2015/0162560 A1 | 6/2015 | Chen et al. |
| 2015/0186099 A1 | 7/2015 | Hall |
| 2015/0187991 A1 | 7/2015 | McGroddy et al. |
| 2015/0207399 A1 | 7/2015 | Li et al. |
| 2015/0213756 A1 | 7/2015 | Wacyk |
| 2015/0280086 A1 | 10/2015 | Jang et al. |
| 2015/0293302 A1 | 10/2015 | Czornomaz et al. |
| 2016/0013167 A1 | 1/2016 | Sakariya et al. |
| 2016/0155892 A1 | 6/2016 | Li et al. |
| 2016/0172253 A1 | 6/2016 | Wu et al. |
| 2016/0240159 A1 | 8/2016 | Ohkawa et al. |
| 2016/0315218 A1 | 10/2016 | Bour et al. |
| 2016/0341942 A1 | 11/2016 | Cheon et al. |
| 2016/0351539 A1 | 12/2016 | Bower et al. |
| 2017/0005151 A1 | 1/2017 | Kim et al. |
| 2017/0082263 A1 | 3/2017 | Byrnes et al. |
| 2017/0084775 A1 | 3/2017 | Li et al. |
| 2017/0170360 A1 | 6/2017 | Bour et al. |
| 2017/0179097 A1 | 6/2017 | Zhang et al. |
| 2017/0179192 A1 | 6/2017 | Zhang et al. |
| 2017/0186740 A1 | 6/2017 | Cok et al. |
| 2017/0186908 A1 | 6/2017 | Robin et al. |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0338372 A1 | 11/2017 | Teraguchi et al. |
| 2017/0352313 A1 | 12/2017 | Miyake |
| 2017/0371087 A1 | 12/2017 | You et al. |
| 2018/0005562 A1 | 1/2018 | Lin et al. |
| 2018/0024412 A1* | 1/2018 | Kim .................... G02F 1/292 359/315 |
| 2018/0033768 A1 | 2/2018 | Kumar et al. |
| 2018/0084614 A1 | 3/2018 | Bower et al. |
| 2018/0114878 A1 | 4/2018 | Danesh et al. |
| 2018/0180249 A1 | 6/2018 | Yamada et al. |
| 2018/0182298 A1 | 6/2018 | Jang et al. |
| 2018/0211595 A1 | 7/2018 | Takahashi et al. |
| 2018/0211945 A1 | 7/2018 | Cok et al. |
| 2018/0219144 A1 | 8/2018 | Perkins et al. |
| 2018/0226386 A1 | 8/2018 | Cok |
| 2018/0247586 A1 | 8/2018 | Vahid Far et al. |
| 2018/0269234 A1 | 9/2018 | Hughes et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0331258 A1 | 11/2018 | Halbritter et al. |
| 2018/0342492 A1 | 11/2018 | Lu |
| 2018/0358339 A1 | 12/2018 | Iguchi |
| 2018/0358340 A1 | 12/2018 | Wong et al. |
| 2019/0012957 A1 | 1/2019 | Liu et al. |
| 2019/0012965 A1 | 1/2019 | Fu et al. |
| 2019/0044023 A1 | 2/2019 | Cheng et al. |
| 2019/0058081 A1 | 2/2019 | Ahmed et al. |
| 2019/0066571 A1 | 2/2019 | Goward |

(56) References Cited

U.S. PATENT DOCUMENTS

| | | |
|---|---|---|
| 2019/0066587 A1 | 2/2019 | Han |
| 2019/0113199 A1 | 4/2019 | Pellarin et al. |
| 2019/0113727 A1 | 4/2019 | Tamma |
| 2019/0115508 A1 | 4/2019 | Lin et al. |
| 2019/0137757 A1 | 5/2019 | Rousseau |
| 2019/0148606 A1 | 5/2019 | Racz et al. |
| 2019/0165209 A1 | 5/2019 | Bonar et al. |
| 2019/0195466 A1 | 6/2019 | Shimizu |
| 2019/0198716 A1 | 6/2019 | Gordon et al. |
| 2019/0229097 A1 | 7/2019 | Takeya et al. |
| 2019/0235234 A1 | 8/2019 | Hu et al. |
| 2019/0235677 A1 | 8/2019 | Liu et al. |
| 2019/0258346 A1 | 8/2019 | Cheng et al. |
| 2019/0273471 A1 | 9/2019 | Ahmed et al. |
| 2019/0293939 A1 | 9/2019 | Sluka |
| 2019/0302917 A1 | 10/2019 | Pan |
| 2019/0305035 A1 | 10/2019 | Cho et al. |
| 2019/0305036 A1 | 10/2019 | Ahn et al. |
| 2019/0305185 A1 | 10/2019 | Lauermann et al. |
| 2019/0335553 A1 | 10/2019 | Ahmed et al. |
| 2019/0347979 A1 | 11/2019 | Ahmed |
| 2019/0371777 A1 | 12/2019 | Iguchi |
| 2019/0378674 A1 | 12/2019 | Chou et al. |
| 2019/0383474 A1 | 12/2019 | Vasylyev |
| 2019/0393198 A1 | 12/2019 | Takeya |
| 2020/0052033 A1 | 2/2020 | Iguchi |
| 2020/0105184 A1 | 4/2020 | Shao et al. |
| 2020/0119233 A1 | 4/2020 | Dupont |
| 2020/0134624 A1 | 4/2020 | Zhang et al. |
| 2020/0203580 A1 | 6/2020 | Marutani |
| 2020/0227594 A1 | 7/2020 | Kuo |
| 2020/0251638 A1 | 8/2020 | Morris et al. |
| 2020/0342194 A1 | 10/2020 | Bhat et al. |
| 2020/0343230 A1 | 10/2020 | Sizov et al. |
| 2020/0356016 A1 | 11/2020 | Sampayan et al. |
| 2020/0366067 A1 | 11/2020 | David et al. |
| 2021/0005775 A1 | 1/2021 | Chen et al. |
| 2021/0043617 A1 | 2/2021 | Onuma et al. |
| 2021/0124247 A1 | 4/2021 | Mezouari et al. |
| 2021/0134624 A1 | 5/2021 | Zhang |
| 2021/0136966 A1 | 5/2021 | Jang et al. |
| 2021/0242370 A1 | 8/2021 | Lee et al. |
| 2021/0272938 A1 | 9/2021 | Chang et al. |
| 2021/0313497 A1 | 10/2021 | Pourquier |
| 2021/0325594 A1 | 10/2021 | Meng et al. |
| 2021/0375833 A1 | 12/2021 | Lee et al. |
| 2021/0391514 A1 | 12/2021 | Koyama et al. |
| 2021/0405276 A1 | 12/2021 | Brick et al. |
| 2022/0051614 A1 | 2/2022 | Baumheinrich et al. |
| 2022/0093833 A1 | 3/2022 | Takiguchi et al. |
| 2022/0101781 A1 | 3/2022 | Baumheinrich et al. |
| 2022/0102583 A1 | 3/2022 | Baumheinrich et al. |
| 2022/0123046 A1 | 4/2022 | Behringer et al. |
| 2022/0231193 A1 | 7/2022 | Boss et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |
| 2022/0375991 A1 | 11/2022 | Behringer et al. |

FOREIGN PATENT DOCUMENTS

| | | |
|---|---|---|
| DE | 19911717 A1 | 9/2000 |
| DE | 10009782 A1 | 9/2001 |
| DE | 102006045702 A1 | 4/2008 |
| DE | 102007043877 A1 | 1/2009 |
| DE | 102007046339 A1 | 4/2009 |
| DE | 102005063159 B4 | 5/2009 |
| DE | 102012008833 | 11/2012 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 A1 | 3/2012 |
| EP | 2477240 A1 | 7/2012 |
| EP | 2506321 A1 | 10/2012 |
| EP | 2609624 A2 | 7/2013 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 3367374 A1 | 8/2018 |
| JP | S62269385 A | 11/1987 |
| JP | H06244457 A | 9/1994 |
| JP | 2004-228297 A | 8/2004 |
| JP | 2005244220 A | 9/2005 |
| JP | 2005346066 A | 12/2005 |
| JP | 2007264610 A | 10/2007 |
| JP | 2007324416 A | 12/2007 |
| JP | 2009141254 A | 6/2009 |
| JP | 2009186794 A | 8/2009 |
| JP | 2009260357 A | 11/2009 |
| JP | 2010272245 A | 12/2010 |
| JP | 2013048282 A | 3/2013 |
| JP | 2013110154 A | 6/2013 |
| JP | 2014019436 A | 2/2014 |
| JP | 2015099238 A | 5/2015 |
| JP | 2016208012 A | 12/2016 |
| JP | 2019009438 A | 1/2017 |
| JP | 2017152655 A | 8/2017 |
| JP | 2017-533453 A | 11/2017 |
| JP | 2017535966 A | 11/2017 |
| JP | 2018063975 A | 4/2018 |
| JP | 2018-191006 A | 11/2018 |
| JP | 2019029473 A | 2/2019 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |

(56) References Cited

FOREIGN PATENT DOCUMENTS

| WO | 2017197576 A1 | 11/2017 |
| WO | 2018117382 A1 | 6/2018 |
| WO | 2018123280 A1 | 7/2018 |
| WO | 2018179540 A1 | 10/2018 |

OTHER PUBLICATIONS

International Search Report and Written Opinion issued in International Patent Application No. PCT/EP2020/053498 on May 8, 2020.

Mingzeng Peng, Yan Zhang, Yudong Liu, Ming Song, Junyi Zhai, Zhong Lin Wang, "Magnetic-Mechanical-Electrical-Optical Coupling Effects in GaN-Based LED/Rare-Earth Terfenol-D Structures," vol. 26, Issue 39, Oct. 22, 2014, pp. 6767-6772.

Buljan et al., "Ultra-compact multichannel freeform optics for 4xWUXGA OLED microdisplays," Proceedings of the SPIE, vol. 10676, Digital Optics for Immersive Displays2018, 9 pages.

Fortuna, "Integrated Nanoscale Antenna-LED for On-Chip Optical Communication," UC Berkeley, 2017, 146 pages.

Huang et al., "Metasurface holography: from fundamentals to applications," Nanophotonics, vol. 7, Issue 6, 2018, pp. 1169-1190.

International Search Report in PCT/EP2020/058547, mailed Mar. 26, 2022, 4 pages.

International Search Report in PCT/EP2020/058997, mailed Mar. 5, 2021, 4 pages.

Li et al., "Waveguiding in Vertical Cavity Quantum-Well Structure Defined by Ion Implantation," Journal of Lightwave Technology, vol. 16, Issue 8, 1998, pp. 1498-1508.

Notice of Allowance in U.S. Appl. No. 17/474,975, mailed Jul. 27, 2022, 47 pages.

Ogihara et al., "1200 Dots-Per-Inch Light Emitting Diode Array Fabricated by Solid-Phase Zinc Diffusion," IEICE Transactions on Electronics, vol. 80, Issue 3, 1997, pp. 489-497.

Stevens et al., "Varifocal technologies providing prescription and VAC mitigation in HMDs using Alvarez lenses," Proceedings of the SPIE, vol. 10676, Digital Optics for Immersive Displays, 2018, 18 pages.

Tomioka et al., "Selective-area growth of III-V nanowires and their applications," Journal of Materials Research, vol. 26, Issue 17, 2011, pp. 2127-2141.

Waldern et al., "DigiLens switchable Bragg grating waveguide optics for augmented reality applications," Proceedings of the SPIE, vol. 10676, Digital Optics for Immersive Displays, 2018, 17 pages.

Wheelwright et al., "Field of View: not just a number," Proceedings of the SPIE, vol. 10676, Digital Optics for Immersive Displays, 2018, 8 pages.

Yu et al., "Hybrid LED driver for multi-channel output with high consistency," IEEE 11th International Conference on ASIC (ASICON), 2015, 4 pages.

\* cited by examiner

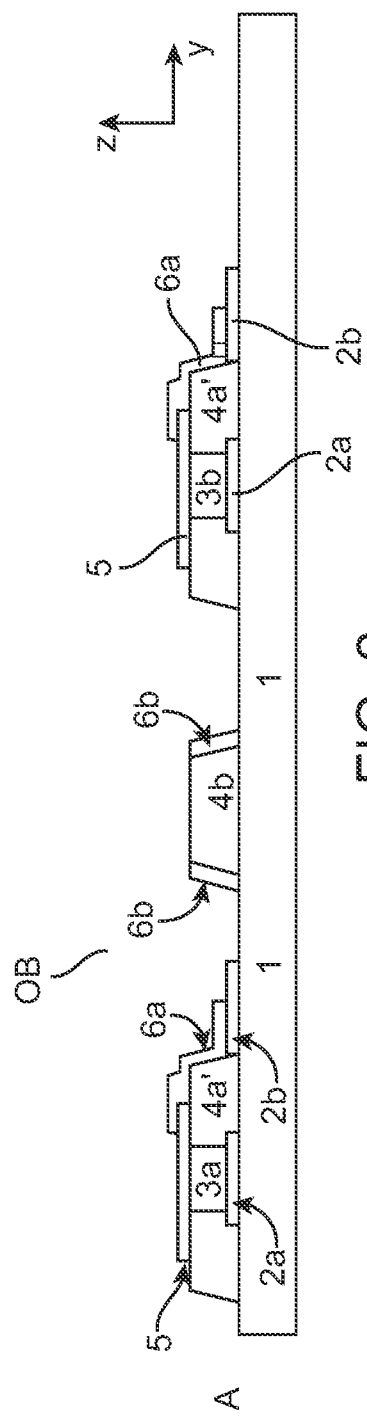
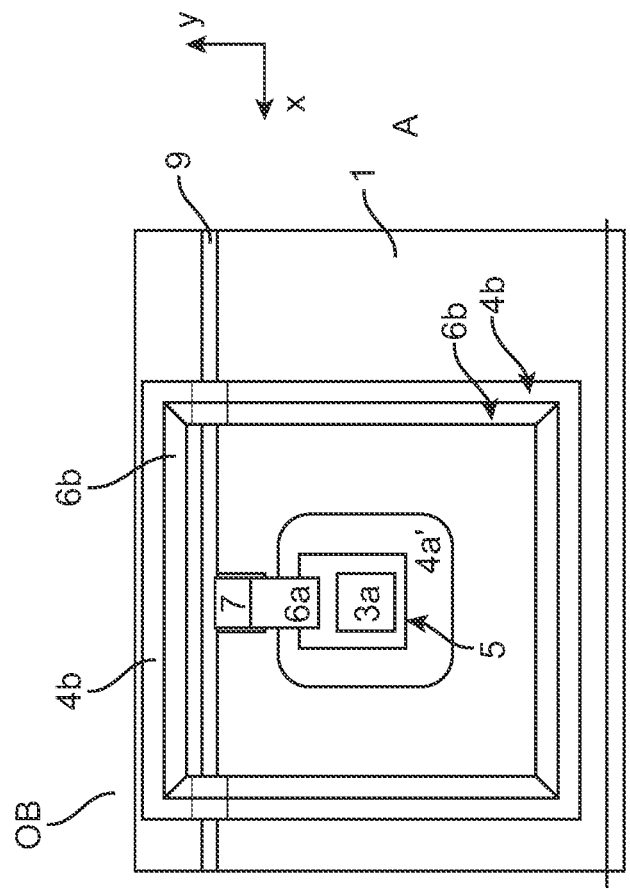

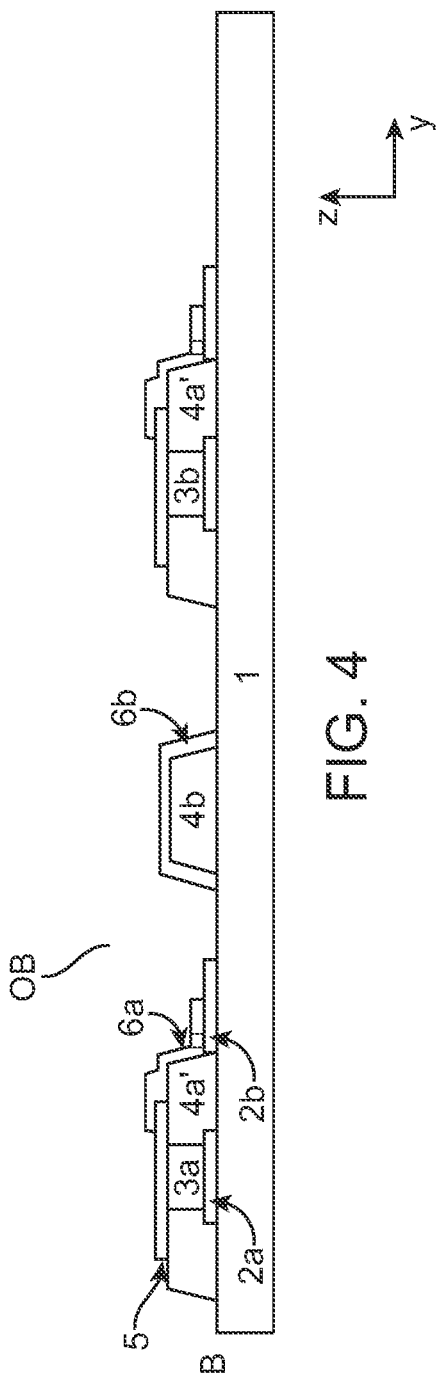
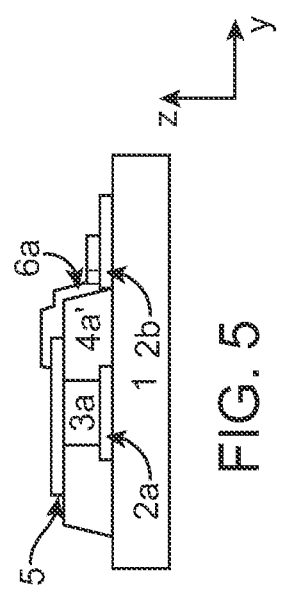

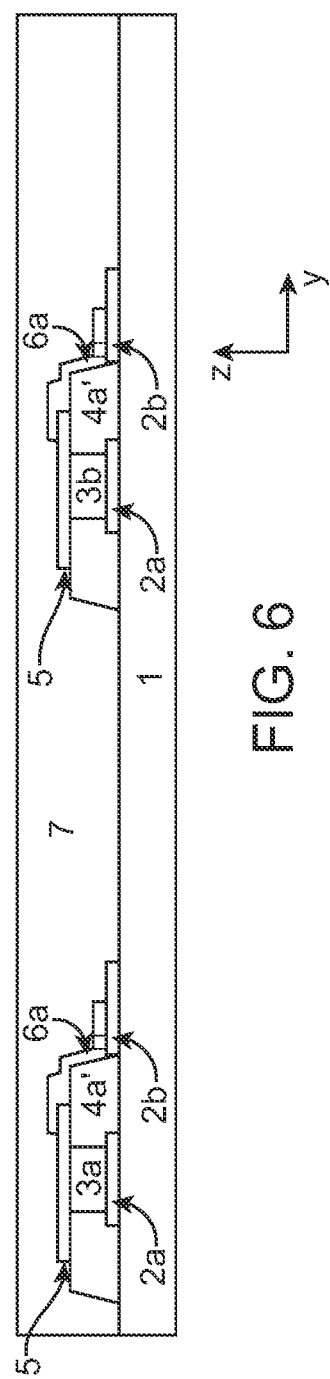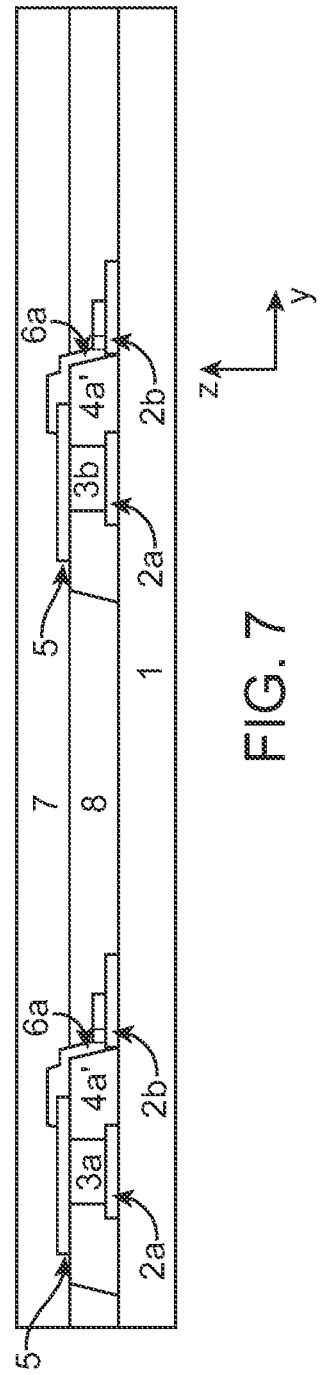

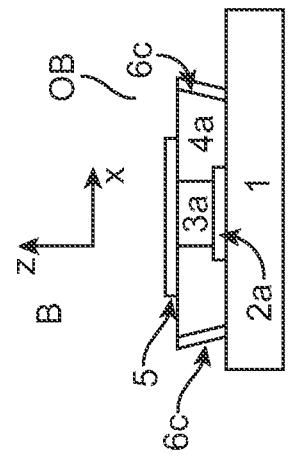
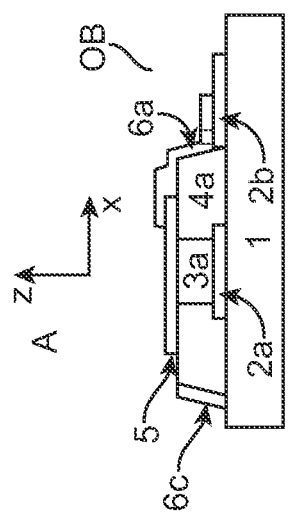
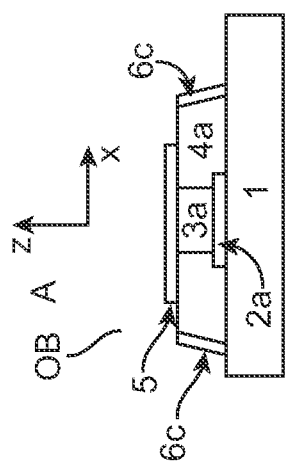
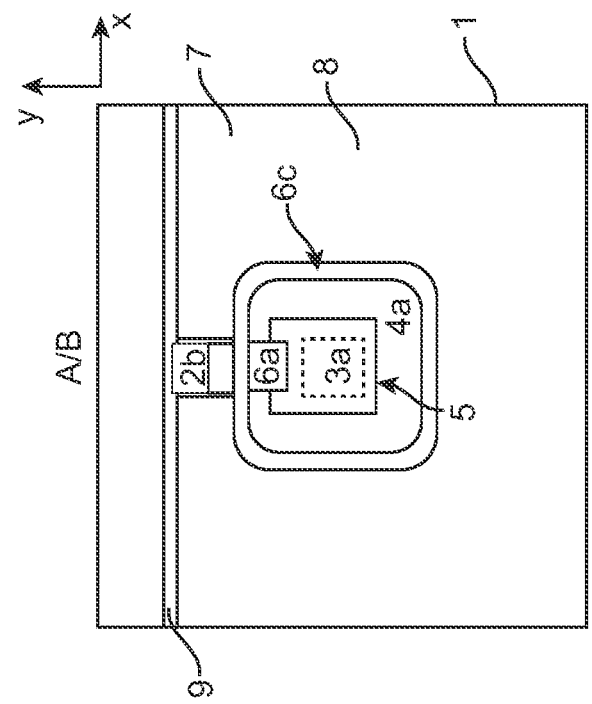

OPTOELECTRONIC COMPONENT, OPTOELECTRONIC ARRANGEMENT AND METHOD

This patent application is a 35 U.S.C. § 371 National Phase Application of PCT Application No. PCT/EP2020/053498 filed on Feb. 11, 2020 which claims the priorities of the German applications DE 10 2019 103 365.9 of Feb. 11, 2019, DE 10 2019 110 499.8 of Apr. 23, 2019, and DE 10 2019 111 767.4 of May 7, 2019, and the priority of the international application PCT/EP2020/052191 of Jan. 29, 2020, the disclosure of which are incorporated herein by way of reference. Additionally, this patent application is related to the following co-pending patent applications: U.S. application Ser. No. 17/038,283, entitled "µ-LED, µ-LED Device, Display and Method for the Same," filed Sep. 30, 2020; U.S. application Ser. No. 17/039,283, entitled "µ-LED, µ-LED Device, Display and Method for the Same," filed Sep. 30, 2020; U.S. application Ser. No. 17/039,097, entitled "µ-LED, µ-LED Device, Display and Method for the Same," filed Sep. 30, 2020; U.S. application Ser. No. 17/039,422, entitled "µ-LED, µ-LED Device, Display and Method for the Same," filed Sep. 30, 2020; U.S. application Ser. No. 17/039,482, entitled "µ-LED, µ-LED Device, Display and Method for the Same," filed Sep. 30, 2020; U.S. application Ser. No. 17/426,520, entitled "µ-LED, µ-LED Device, Display and Method for the Same," filed Jul. 28, 2021; and U.S. application Ser. No. 17/426,456, entitled "µ-LED, µ-LED Device, Display and Method for the Same," filed Jul. 28, 2021.

BACKGROUND

Today, light-emitting diodes or optoelectronic components in general are indispensable in many different applications. In addition to displays and general visual displays, they are also used for large-area displays, for billboards or video walls. But also for luminous surfaces in office areas or private rooms, systems with such components are increasingly used, because through a more individual control, different creative lighting concepts can be realized.

In addition, there are classic lighting applications, such as in the automotive sector. In addition to displays and the like, there are also headlights and other lights that can be realized with pixelated arrays, for example. These should be designed in such a way that light guidance may be possible with additional optics, so that other road users are not dazzled. Many of these applications have in common that a number of optoelectronic components are arranged in rows and columns on a substrate or backplane, whereby further measures can be applied for light guidance and coupling.

In addition, it is required that the best possible light extraction is achieved with simultaneously low power consumption. Accordingly, the light generated by the optoelectronic components should be coupled out and emitted as efficiently as possible. The following application deals with this topic in view of the above-mentioned applications.

SUMMARY

Various designs based on vertical or horizontal LED architectures are suitable for the manufacturing of displays, indicators or light sources. Here, short switching times with sufficient current-carrying capacity are of particular importance. At the same time, the emitted light should be as collimated as possible.

When horizontal optoelectronic components are used, both the anode and cathode contacts are usually realized by means of separate metallic lead wires, both contacts being located on the underside of the chip. For both the cathode and the anode, the metallic leads are led to each pixel. When vertical optoelectronic components are used, the anode contact on the underside of the chip is realized by separate metallic leads, while the cathode contact on the top of each chip is realized by a common cathode. In both cases, the supply lines should be as short as possible to keep parasitic capacitances low.

As already explained, the optoelectronic components are manufactured either monolithically or individually and then further processed on a substrate. The backplane (in case of a backplane assembly; in case of a monolithic assembly, the backplane can also serve as a substrate or the growth substrate is replaced by the backplane) contains the control electronics. A distinction is made between passive matrix backplanes with IC circuits and active matrix backplanes with TFT circuits. In passive matrix backplanes with IC circuits for driving the LED, the cathode and anode leads are usually routed directly to the pixels or in subpixels. The pixels or subpixels are controlled by the micro-integrated circuits.

In the realization of active matrix backplanes, the individual pixels are controlled by means of integrated TFT circuits (TFT=Thin Film Transistor). In this application, various arrangements are proposed in which the supply lines can be kept short in order to achieve high switching times. In addition, a common cathode or anode connection is realized. The arrangements and concepts disclosed herein are suitable for various applications. Among them are e.g. applications for automotive, for displays or video walls and in general different illuminants. It is essential that the optoelectronic components can be designed separately or monolithically and that their edge length is in the range of 200 µm to 500 µm or even more. This range allows simple processing and transfer of the components.

For certain applications a directed light or radiation is of importance. In addition to the aspect of preventing crosstalk between adjacent elements, in these applications light should be directed, i.e. emitted in a specific direction. In automotive applications, this aspect is important because the resulting light cone may be controlled by an optic arranged upstream. Stray light can dazzle oncoming traffic, which is reduced by the directed light emission.

For displays and also for many area displays, on the other hand, a defined radiation characteristic should be achieved. Light generated in an optoelectronic component or LED should on the one hand not interact with neighbouring optoelectronic components, on the other hand, the light should also be decoupled in order to optimize the light efficiency at a given current intensity. In the following aspects, different measures are presented to improve the radiation characteristics of an optoelectronic component or an arrangement with such a component by means of reflective layers and other measures.

With some optoelectronic components, light is emitted laterally. This effect is often undesirable, because crosstalk to in neighbouring components can lead to interference or other effects that worsen the visual impression. Also, stray light may be directed in undesirable directions by lenses or other light-shaping elements. Finally, it is desirable to make as large a proportion as possible of the light generated usable. In addition, a Lambertian radiation characteristic of the display is required for many applications. This means in particular that the display should be equally bright when viewed from all sides. A strong edge emission of the chip results in a non-Lambertian radiation characteristic.

Among other things, optoelectronic components are realized with a vertical design, i.e. with one contact each on the top and bottom side of the chip. In order to electrically connect a so-called vertical LED to a substrate, a so-called "top contact" must be deposited and structured on a second contact of the LED (opposite or above the). A planarization and/or passivation layer is also applied around the chip. It should be mentioned at this point, however, that the invention, and in particular reflective structures, are not limited to designs of vertical optoelectronic components. Rather, the aspects below, e.g. the arrangements with a reflector structure can also be realized with optoelectronic components whose contacts are arranged on the same side (so-called horizontal LEDs).

According to a first aspect, a method for manufacturing an optoelectronic arrangement comprising at least one optoelectronic component is proposed. The component may be, inter alia, a light emitting diode, at least part of whose light also emerges laterally with a portion parallel to the active layer. In the method, a first contact region and a second contact region are structured on one side of a substrate. The optoelectronic component is likewise applied to the substrate or is manufactured there by structuring from several semiconductor layers on the substrate.

Then, a first metal mirror layer and a second metal mirror layer are applied, wherein the first metal mirror layer electrically connects a contact layer attached to a second contact of the optoelectronic component to the second contact region, and the second metal mirror layer is formed on a reflector structure arranged on the substrate. The reflector structure can be obtained from a planarization layer with subsequent structuring. In some aspects, the reflector structure frames the optoelectronic component at a distance. In other aspects, part of the planarization layer can be structured so that it surrounds the optoelectronic component.

In one aspect, the proposed arrangement comprises an optoelectronic component in particular an optoelectronic component electrically contacted by means of a first metal mirror layer and a reflector structure in particular surrounding the latter and coated with a second metal mirror layer.

According to a second aspect, an arrangement with at least one optoelectronic component is proposed, wherein on one side of a substrate a first contact of the vertical optoelectronic component is connected to a first contact region. On the same side of the substrate, a second contact of the vertical optoelectronic component facing away from the substrate is connected to a second contact region by means of a contact layer, in particular a semi-transparent contact layer, and a first metal mirror layer. In addition, a reflector structure is formed which has a second metal mirror layer on its side flanks and which surrounds the optoelectronic component at a distance. The reflector structure includes reflective sidewalls in some aspects. These can run at an angle to deflect the light. In other aspects, the sidewall can also be non-linear, for example, square or parabolic.

The processing of a second contact or a top contact can be used to produce optical decoupling structures on the substrate in a single step. A top contact is formed here in particular by a second contact of the optoelectronic component, a contact layer, a first metal mirror layer and a second contact region. Here, the contact layer attached to the second contact of the optoelectronic component is electrically connected to the second contact region by means of the first metal mirror layer.

An optical out coupling structure is formed here by means of a reflector structure which is coated by means of a second metal mirror layer. A further optical out coupling structure can be provided by a lens which is arranged in the beam path of the arrangement and in particular of the optoelectronic component. Thus, the lens is arranged in such a way that light hits the lens either after reflection at the structure or directly from the component.

To produce a top contact, the optoelectronic components are first embedded in a planarization layer. This can be opened photolithographically at the second contact area for the second contact or for the top contact (upper contact) on the substrate. This structuring process is used to form structures for reflectors, especially reflectors, on the substrate from the planarization layer in the same step. After deposition of a transparent contact layer, a structured application of a metal mirror layer can be performed as a metal bridge between the second contact and the second contact area.

This is necessary because the contact layer is not suitable for bridging large height differences. This metallization process can be used to simultaneously mirror reflector structures.

This makes the production of displays more cost-effective and faster, as conventional separate lithography processes for forming reflectors are no longer required. By providing reflectors from a planarization layer with a top contact metal mirror layer, efficiency and contrast can be increased and the radiation characteristics of the display improved without additional processing effort.

The aspects presented further above for a reflective layer or mirror can also be applied or supplemented to other designs of LEDs and optoelectronic components, as already indicated, for example, to the following vertical LEDs with circumferential structure.

According to a first aspect, a device comprising a substrate and an optoelectronic component fixed to one side of the substrate is proposed. On a side facing away from the substrate, the optoelectronic component comprises an electrical contact which is electrically connected to an electrical control contact by means of a mirror coating, the mirror coating at least partially covering the substrate surface facing the component.

The mirroring therefore has two functions. On the one hand, it serves to deflect light in the direction of radiation, on the other hand, it transports the current. By means of the common cover contact or the common cover electrode, fast switching times can be realized for various applications such as displays. This enables the provision of pulse width modulation dimming concepts, especially for improving panel efficiency in combination with an improvement of optical parameters, such as the angle dependence of an emission and the contrast.

In a method of fabricating such an assembly, the first step is to provide a substrate having a number of contacts on its surface and to attach an optoelectronic component to one of those contacts. The attachment may use conventional transfer and attachment techniques, some of which are also presented in this disclosure. The optoelectronic component is configured as a vertical component and also includes a contact on one of the substrate surfaces. A reflective layer is formed on the substrate surface, which is electrically connected to an electrical control contact on the surface of the substrate and covers the surface at least partially. In a last step, a transparent cover electrode is formed on the further contact, which electrically contacts the mirror coating.

In addition, the use of a mirror coating to expand the current, improve the current carrying capacity and switching times can also be implemented in combination with cavity structures. Such cavities can then also be used to improve decoupling efficiency, the angle dependence of emissions and contrast. For this purpose, some aspects of the substrate include an elevation surrounding the optoelectronic component. Alternatively, instead of an elevation, a cavity may be provided in the substrate surface in which the optoelectronic component is arranged. In addition to one component, three components can also be surrounded or arranged in such a way that they together form a single pixel as subpixels.

In both cases, optionally bevelled side surfaces of the cavity or the elevation are provided with the mirror coating. This structure is similar to the one mentioned above. The angle of these side surfaces with the substrate surface can have different values depending on the desired characteristics. In particular, it can also change so that the side flanks show a parabolic or other non-linear course. In some aspects, the circumferential mirror structure disclosed in this application can be used. The height of the elevation or the depth of the cavity is chosen such that the optoelectronic component is flush with the top of the elevation or cavity. This allows the cover electrode to terminate. This is particularly useful, if the mirror coating is arranged on the top side so that the cover electrode rests on the mirror coating. In some aspects, the cover electrode thus forms a transparent support structure.

In some aspects, a gap between optoelectronic components or the region within an elevation or a cavity is filled with a transparent insulation layer, which thus surrounds the components. In particular, the transparent insulation layer closes at the level of the remote contact of the component, so that the cover electrode rests on the insulating material.

In some aspects, the mirror surface arranged on the substrate surface and possibly surrounding structure surrounds not only one but a large number of components. These can be designed as redundant chips, so that if one chip fails, the other one can take over the function. A more uniform radiation is generated by a circumferentially arranged mirror surface. Several components can also be arranged within the circumferential mirror surface to generate light of different wavelengths. A circumferential mirror surface can separate different pixels in a visual display device so that optical crosstalk between pixels is reduced. Such a separation presented here can also be achieved in pixelated arrays, e.g., for illuminants in motor vehicles.

The mirror coating is connected in series with the cover electrode and the control contact of the substrate and comprises a highly reflective material, in particular of Al, Ag, AgPdCu, Nd, Nb, La, Au, Cu, Pd, Pt, Mg, Mo, Cr, Ni, Os, Sn, Zn as well as alloys or combinations thereof. These also effectively widen the current. The cover electrode may comprise a transparent electrically conductive oxide layer, in particular a material made of ITO, IGZO. Further examples of cover electrode material can be transparent conductive oxides, such as metal oxides, zinc oxide, tin oxide, cadmium oxide, indium-doped tin oxide (ITO), aluminium-doped tin oxide (AZO), $Zn_2SnO_4$, $CdSnO_3$, $ZnSnO_3$, $In_4Sn_3O_{12}$ or mixtures of different transparent conductive oxides.

The transparent insulating layer may include SiO or other insulating transparent materials mentioned here.

According to a further embodiment, the direct electrical contact of the cover electrode with the mirror coating can be created by means of a contacting overlap of a cover electrode surface and a mirror coating surface, especially on the surface of the elevation or at one end of a recess or cavity.

In this way, a reliable low-impedance contact can also be provided. Particularly in the case of several such cavities or elevations arranged in series, the cover electrode can rest on several mirror coatings. This allows the current to be applied to the cover electrode over a large area and at several positions.

In some aspects, the mirror layer runs along the surface of the substrate, in particular, partially around the optoelectronic component or components. This increases the reflection over a large area, including the substrate surface.

In some aspects, to ensure contacting, a direct electrical contact of the cover electrode with the mirror coating is provided by a through-hole plating or a via of the mirror coating material through a planarization and/or insulation layer. Additional process steps for realizing a metallic contact between the conductive oxide of the cover electrode and the contact areas on the backplane/substrate are not necessary. A simple bridge can be created from, for example, the ITO cover contact to the CrAl contact area for ACF bonding. This can lead to further cost savings. This via can be realized as openings. In other designs, however, a trench or other structure can be provided in the transparent insulation layer, the inner walls of which are filled with a conductive reflective layer for contacting. This creates a good electrical contact on the one hand and a reflective structure on the other hand and in addition to good light reflection, optical crosstalk is reduced in some areas.

In some cases, the isolation layer at the edge of a pixel is bevelled and the reflective layer is exposed. The cover electrode extends along this sloped surface and thus contacts the reflective layer. In this way, a compact design can be provided. The flanks or inner walls of the opening have an angle depending on the desired radiation characteristics. These can correspond to those revealed here. In this way, further material breakage at transition edges can be avoided.

Another aspect deals with the production of a pixel or module comprising a plurality of said arrangements arranged in rows and columns. Each pixel may be embedded in a cavity or surrounded by an elevation. The cover electrode can thus be used as a common connector for a plurality of such arrangements. Moreover, decoupling structures may be provided on the cover electrode. Moreover, such a cover electrode may also form a support structure so that light is decoupled therethrough.

Alternative structures include photonic structures that are suitable for further collimating light. Converters can also be attached to the cover electrode. In this way, an optoelectronic component that generates blue light, for example, can be used to convert it by means of the converter layer. In this case, further reflective structures can be built on the cover electrode to avoid optical crosstalk into another pixel. In addition, photonic structures that collimate the converted light are also conceivable here again.

In the previous aspects of improving light extraction, the focus was on the directionality of the emitted light, among other things. For many applications, however, a Lambertian radiation characteristic is required. This means that a light-emitting surface ideally has a uniform radiation density over its area, resulting in a vertically circular distribution of radiant intensity. For a user, this surface then appears equally bright from different viewing angles. In addition, such a uniform distribution can be more easily reshaped by light-shaping elements arranged downstream.

Therefore, an arrangement is proposed which comprises a planar carrier substrate and at least one optoelectronic component and which is designed for rear decoupling. The optoelectronic component is a light-emitting diode or another element for generating light. A flat carrier substrate is understood to be, for example, a silicon wafer, semiconductor materials such as LTPS or IGZO, insulation material or similar suitable flat carrier structure, which can accommodate a large number of optoelectronic components arranged next to each other on its surface.

The function of such a carrier substrate is, among other things, to accommodate functional elements such as ICs, electronics, power sources for the optoelectronic components, electrical contacts, leads and connections, but also in particular the accommodation of the light-emitting diodes or optoelectronic components. The carrier substrate can be rigid or flexible. Typical dimensions of a carrier substrate can, for example, be 0.5-1.1 mm thick. Polyimide substrates with thicknesses in the range of 15 µm are also known.

The at least one optoelectronic component is arranged on a assembly side of the carrier substrate. In other words, the carrier substrate has two opposing main surfaces, which are referred to here as the assembly side and the display side or light emission side. By assembly side, it is intended to mean the surface of the carrier substrate that receives the at least optoelectronic component or to which the optoelectronic component is attached. In some aspects, the carrier substrate may optionally include further optical or electrical and mechanical components or layers.

The display side is intended to describe the side of the carrier substrate that faces an observer or from which the light generated by the components emerges. Additionally, a carrier substrate plane is described as extending parallel to both main surfaces of the carrier substrate in the same plane. The at least one optoelectronic component is configured to emit light transverse to the carrier substrate plane in a direction away from the carrier substrate. However, this property should not exclude that light components are also emitted directly or indirectly in the direction of the mounting side of the carrier substrate.

The arrangement further comprises a two-dimensional reflector element. This is based on the idea that a more uniform spatial distribution of the light over the surface of the arrangement can be made possible by reflection. For this purpose, the reflector element is spatially arranged on the assembly side relative to the at least one optoelectronic component and is designed with regard to its shape and nature in such a way that light emitted by the at least one optoelectronic component is reflected in the direction of the carrier substrate.

In other words, the reflector element is placed in an area around the at least one optoelectronic component into which the emitted light of the component is emitted. The reflector element can, according to an example, be a separate prefabricated microelement that is separately applied. Alternatively, the reflector element may be implemented by side walls of a cavity and a reflective layer. The aspects of a cavity and a reflective layer shown above form one embodiment of such a reflector element. Typical dimensions of such a reflector element may be in the range of 200 µm to 700 µm in diameter, in particular between 300 µm and 600 µm, depending on the embodiment. According to one aspect, the reflector element is configured as a reflective coating or layer of the at least one optoelectronic component. In this regard, according to one example, the at least one component can have a transparent or partially transparent coating such as IGZO on its surface, to which a reflective layer is then applied.

The arrangement is suitable, among other things, for generating a pixel of a display or for lighting applications in the automotive sector.

The reflective layer can, for example, be metallic or contain a metal in a mixture of substances. The aim here is that as much of the light emitted by the at least one optoelectronic component as possible is reflected in order to achieve a high yield. The carrier substrate is configured to be at least partially transparent so that light reflected by the reflector element strikes the surface of the mounting side of the carrier substrate and propagates through the carrier substrate. This light emerges at least partially on the opposite display side of the carrier substrate and can thus be perceived as a pixel by the viewer.

In other words, the emitted light is decoupled at the back or rear of the opposite display side of the carrier substrate. The reflection effects, refraction effects and, if necessary, damping effects can thus be used to achieve advantageous more uniform illumination and a more homogeneous distribution of luminous intensity. According to an example, the reflector element is arranged and configured in such a way that a Lambertian radiation characteristic is achieved.

In one aspect, the reflector element has an additional diffuser layer on its side facing the at least one optoelectronic component. In particular, this is intended to scatter light reflected from the at least one optoelectronic component. Alternatively or additionally, a reflector material comprises diffuser particles. By diffusion is meant here that a further scattering or distribution of the light in a surrounding spatial area should be achieved. This can also have a beneficial effect on the scattering or distribution of light and thus achieve a more uniform or homogeneous distribution of the light intensity, especially on the display side of the carrier substrate.

A diffuser layer can be understood as an additional layer on the reflector element, which can be either uniform throughout, but also interrupted or only partially applied. In one aspect, the diffuser layer and/or the diffuser particles have $Al_2O_3$ and/or $TiO_2$. These materials can support a diffusion of the emitted light due to their structural properties. While a diffuser layer can only be applied to the surface of the reflector, diffuser particles can, for example, be part of a mixture of materials of the entire reflector and thus be easier to manufacture.

According to an aspect, the reflector element surrounds the at least one component or light emitting diode in a circular, polygonal or parabolic manner. The underlying consideration may be seen in that the at least one optoelectronic component in many cases has a spatially wide radiation pattern. This means that light is emitted in a wide angular range starting from a small area. It is desirable that as much of this emitted light as possible is captured by the reflector element and deflected or reflected towards the display side of the carrier substrate. In this context, it may also be provided, for example, that the at least one optoelectronic component comprises a first light-emitting diode and a second light-emitting diode provided for redundancy. The latter can take over the function of the first light-emitting diode in the event of a production-related failure thereof. The reflector element, which surrounds both optoelectronic components, thus achieves uniform radiation regardless of which of the two optoelectronic components is activated during operation. In another aspect, the reflector element surrounds at least three individual optoelectronic components, which emit different colours during operation. Thus, a reflector element may be provided for each pixel of a display, display device, pixelated array, or other device.

Depending on the radiation pattern of the at least one optoelectronic component, according to an example, arc-shaped, round, dome-shaped, cap-shaped or similar shapes of the reflector element are conceivable. The reflector element can, also according to an example, be made in one or more parts or be provided with recesses or interruptions. According to another example, the reflector element has different reflection properties depending on the wavelength of the light. This can be achieved, for example, by structures on the reflector element or its structural composition.

According to one example, the reflector element is configured as a planar surface arranged at least partially parallel to the carrier substrate plane above the at least one component. According to an aspect, the reflector element forms an electrical contact of the at least one optoelectronic component. The consideration here is that due to the, for example, metallic design of the reflector element, a simultaneous use as a connection contact for the optoelectronic component can be considered. For this purpose, according to one example, an electrical contact is to be provided with one of the connections of the component.

According to one aspect, the reflector element is configured and shaped such that at least 90% of the light emitted by the at least one optoelectronic component impinges on the assembly side of the carrier substrate at an angle of 45°-90° relative to the carrier substrate plane. According to an example, this proportion is at least 95%, according to another example at least 80%. The underlying idea is the need for the highest possible yield. This means that as much of the light emitted by at least one optoelectronic component as possible should be emitted on the display side of the carrier substrate.

One effect that can occur with flat transparent or partially transparent substrates is total reflection. This means that light hitting the surface of the assembly side at an acute angle is refracted when entering the denser medium of the carrier substrate. As a result, the light is reflected multiple times within the carrier substrate between the assembly side and the display side and does not exit the carrier substrate because of the too acute angles to the interfaces. These proportions are usually to be considered as losses. In order to avoid these losses, it may be desirable for the light to strike the surface of the assembly side of the carrier substrate at the greatest possible angle, ideally perpendicularly. Accordingly, the reflector element is configured to create these angular relationships and in particular to reduce crosstalk between the pixel elements. In one aspect, the carrier substrate comprises polyimide or glass. Polyimide is a material that can be used especially for flexible displays. Glass can serve as a mechanically very stable base material for rigid displays.

According to an aspect, a passivation layer is additionally provided to attenuate or eliminate reflections at mesa edges of the at least one optoelectronic component. A mesa edge is defined as a wall or contour that generally slopes steeply to form the boundary of the at least one component. This is arranged with its surface transverse to the carrier substrate plane. To avoid crosstalk, it is desirable that no light passes over in the direction of the respective adjacent pixel element. For this purpose, light components that emerge in this direction should be eliminated or at least attenuated by an appropriate damping layer or passivation layer. The advantage here can be better contrast and reduction of optical crosstalk.

According to an aspect, a light-absorbing coating is provided on the assembly side and/or the display side of the carrier substrate outside the reflector element. It can be considered desirable that the non-active areas between the components, especially between different pixels, are opaque or attenuate light in order to improve contrast and darker impression. The light-absorbing coating is therefore placed outside the reflector element. According to an aspect, the display side of the carrier substrate has a roughened or uneven and/or roughened structure. This structure is such that it causes scattering or diffusion effects for the wavelength of the relevant light spectrum. This can have the advantage, for example, that a higher proportion of the light transmitted through the carrier substrate can be coupled out at the display side. Due to the rough structure, more favourable structural angular relationships are created, which can allow more effective decoupling.

According to an aspect, a colour filter element is arranged on the display side of the carrier substrate opposite the reflector element. This colour filter element allows a primary colour spectrum of the least one optoelectronic component to pass and attenuates other colour spectra. An advantage can be a better colour rendering and better contrasts by eliminating light portions of adjacent pixel elements with different colours.

Furthermore, a method for manufacturing an optical pixel element is proposed. Here, at least one optoelectronic component is first attached to an assembly side of a flat carrier substrate. Thereafter, a reflector element is produced, for example as a reflective layer of the at least one component. Alternatively, the reflector element can also be formed by side walls surrounding the component connected to a transparent cover electrode. In this case, the transparent cover electrode also forms the planar carrier substrate. According to an example, before attaching the at least one optoelectronic component to the carrier substrate, a display side of the carrier substrate is processed for structuring and/or roughening. An advantage can be seen in the fact that the respective surfaces can be finished before the more sensitive electronic and optical components are applied to the assembly side.

BRIEF DESCRIPTION OF THE DRAWINGS

In the following section, some of the above mentioned and summarized aspects are explained in more detail using various explanations and examples.

FIG. 2 shows a first embodiment of a device or an array comprising two optoelectronic components and a reflector structure arranged therebetween in cross-section according to some aspects of the proposed concept;

FIG. 3 illustrates a part of the first embodiment of the arrangement according to the proposed principle as a top view;

FIG. 4 shows a second embodiment of a proposed device in cross-section with a reflector structure interposed therebetween, which is covered by a reflective structure;

FIG. 5 is a cross-sectional view of the first embodiment of the proposed electrically contacted component;

FIG. 6 illustrates in cross-section further aspects of the proposed concept in a third embodiment of a proposed device or array;

FIG. 7 shows a fourth embodiment of a proposed device or array in cross-section;

FIGS. 10 to 12 show various embodiments of optoelectronic components in cross-section, which are arranged in a proposed array or device;

FIG. 13 shows a top view of the embodiments in FIGS. 11 and 12;

DETAILED DESCRIPTION

Figure 1:
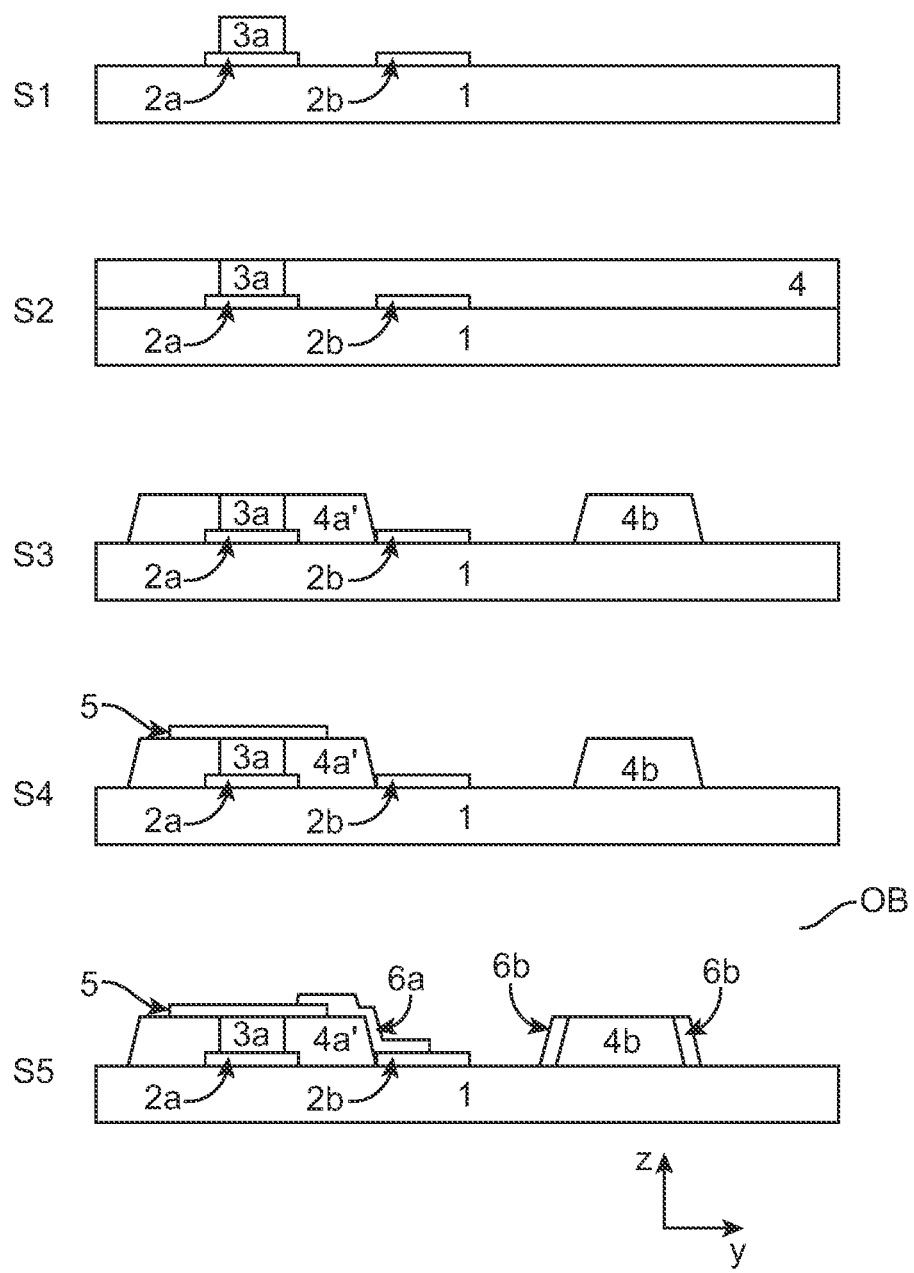
FIG. 1 illustrates various steps of an embodiment of a proposed method for manufacturing an optoelectronic component with a circumferential reflector structure.

For certain applications a directed light or radiation is of importance. In addition to the aspect of preventing crosstalk between adjacent elements, in these applications light should be directed, i.e. emitted in a specific direction. In automotive applications, this aspect is important because the resulting light cone may be controlled by upstream optics. Stray light can dazzle oncoming traffic, which is reduced by the directed emission.

In a display or video wall or other visual display applications, crosstalk of light into neighbouring pixels should be avoided. Sometimes light leaks laterally from optoelectronic components, so that the contrast of a display or video wall is reduced as a result of crosstalk. Similarly, light emitted or radiated laterally often cannot leave the structure due to refractive index jumps. In addition, many applications require a Lambertian radiation characteristic of the display so that the display appears equally bright when viewed from all sides. Therefore, it is suggested to improve the radiation pattern by means of a circumferential reflective layer or mirror around the active layer or the optoelectronic component. In other words, optoelectronic components can be provided with a circumferential mirror to improve the radiation characteristics.

FIG. 2 shows a first embodiment of a proposed arrangement in a Y-Z cross-section. This can be manufactured, for example, by means of the methods described in this application. In a Y-Z cross-section, two electrically contacted optoelectronic components 3a and 3b, are manufactured on a substrate 1, wherein a reflector structure 4b is formed on the substrate 1 in a central region between the two processed components 3a and 3b. The edge angle of the reflector structure 4b is adapted to a required optical decoupling. For example, the slope may strongly depend on the distance between the optoelectronic component and the reflector structure 4b. The two electrically contacted optoelectronic components 3b together with the central coated reflector structure 4b each form an optoelectronic arrangement OB. Component 3b, unlike component 3a, can emit light of other wavelengths. Reference mark 4a' denotes an enclosure. It goes without saying that further components can also be arranged in this embodiment, for example three, so that they then form the sub-pixels of a pixel of a display.

In this embodiment, the components are epitaxially grown on the substrate 1, but they can also be manufactured separately and then placed on the substrate 1. As part of the manufacturing process, the flanks of the reflector structure 4b have been coated with a second metal mirror layer 6b together with the first metal mirror layers 6a of the optoelectronic components, resulting in the structure shown.

The reflector structure 4b, was generated from a planarization layer 4. Likewise, each optoelectronic component comprises the first metal mirror layer 6a, which are respective metal bridges leading from a second contact area 2b to a contact layer 5 of a second contact of the components. The second metal mirror layers 6b cover only the flanks of the reflector structure 4b. Moreover, the second metal mirror layers 6b may omit an area near the substrate 1 to avoid short circuits with conductive paths on the substrate 1. Substrate 1 may further comprise electrical structures for driving the optoelectronic components as described here in this application. Where the substrate is made of or comprises Si or another material generally incompatible with the optoelectronic components, matching layers are also provided. This means that the optoelectronic components have either been generated directly on the substrate 1 or have been transferred to it. Various transfer processes using stamping methods would be suitable for this purpose, for example.

FIG. 3 shows a first embodiment of a proposed optoelectronic arrangement OB as a top view of an X-Y plane. This top view may show the left optoelectronic component according to FIG. 2 with a reflector structure around it. The optoelectronic component is a subpixel and together with others form one pixel each of a display or video wall. The latter are further pixels arranged in several rows and columns.

Thereby, each pixel comprises identically constructed arrangements and optoelectronic components, which are electrically connected accordingly in order to control them individually. According to FIG. 2 and FIG. 3, an optoelectronic device OB has a reflector structure 4b coated with second metal mirror layers 6b, which surrounds an optoelectronic component. The optoelectronic component is arranged centrally for this purpose. Other geometric shapes such as rectangles, circles or triangles or polygons are also possible.

The flank of the reflector structure 4b facing the component 3a is here covered by a second metal mirror layer 6b. In the plan view, an enclosure 4a' is shown along the X-Y plane around the component 3a, which, like the reflector structure 4b, is formed from the material of a planarization layer 4. Starting from a contact layer 5, a first metal mirror layer 6a, in particular in the form of a strip, extends to a second contact region 2b formed on a substrate 1, which may be covered by a coating 7 for sealing or encapsulation. As an example, an electrical conductor track 9 is shown to which the second contact area 2b can be electrically connected. The metal mirror layers 6a and 6b can have the same material or stack of layers.

FIG. 4 shows a second embodiment of a proposed array in cross-section of a Y-Z plane. In contrast to FIG. 2, here a reflector structure 4b is covered with a second metal mirror layer 6b along its entire originally free surface. That is, not only the flanks but also the main surface facing away from a substrate 1 are covered by a continuous second metal mirror layer 6b. The optoelectronic components of FIG. 4 are constructed in the same way as in FIG. 2.

FIG. 5 shows again the essential aspects of the optoelectronic component in cross-section along the Y-Z plane. On one side of a substrate 1 extending along an X-Y plane, a first contact 2a is connected to a semiconductor layer 3a of the optoelectronic component. The active zone is also located in layer 3a. A second contact is formed by the transparent layer 5, which is electrically connected to the first metal mirror layer 6a. Along the X-Y plane, around the body 3a, mechanically contacting it, the electrically insulating enclosure 4a' is formed, along which the contact layer 5 and the first metal mirror layer 6a, in particular in the form of strips, run.

Substrate 1 can itself be a semiconductor and contain electrical structures for control. Alternatively, it can also be produced as a passive matrix or active matrix backplane and contain glass, a polyimide or PCBs (Printed Circuit Boards). The first contact area 2a for the contact near the substrate can contain Mo, Cr, Al, ITO, Au, Ag, Cu and alloys of these. The second contact area 2b for the second contact of the component 3a facing away from the substrate 1 can also comprise Mo, Cr, Al, ITO, Au, Ag, Cu and alloys thereof.

The optoelectronic components shown here are either identical or realized with different material systems, so that they emit different colours during operation. For example, red, green and blue (RGB), red, green, blue and white (RGBW) can be arranged on substrate 1. By using converter materials, the same light emitting diodes can be used, which nevertheless produce different light. Reference mark 4a' denotes the remainder of a planarization layer 4 to provide a surround 4a' to which a contact layer 5 can be applied for a top contact. The enclosure 4a' can also optionally passivate mesa edges of the semiconductor layers of body 3a, for example by means of spin-on dielectrics or by means of a photoresist.

FIG. 6 shows a third embodiment example of a proposed arrangement in cross-section along a Y-Z plane. In contrast to the first embodiment according to FIG. 2 and the second embodiment according to FIG. 4, no reflector structures 4b are formed here. On the other hand, a coating 7 is formed for sealing/encapsulating the contacted optoelectronic components 3a, 3b and/or for optical decoupling. Layer 7 is structured here (not shown) and has a photonic crystal structure from the top side, so that the radiation characteristic is improved. Layer 7 is electrically insulated from the other structures. The coating 7 can contain scattering particles or converter materials. It is usually applied after the optoelectronic components has been manufactured and then planarized.

FIG. 7 shows a fourth embodiment of a proposed arrangement in cross-section along a Y-Z plane. This representation is similar to that of FIG. 6, in which a black encapsulation 8 is formed between the optoelectronic components 3a, 3b under a coating 7 applied to seal/encapsulate the contacted light-emitting body 3a, 3b and/or for optical decoupling. No coated reflector structures 4b are shown here. These reflector structures 4b may be formed on other areas of the array not shown here.

Figure 8:
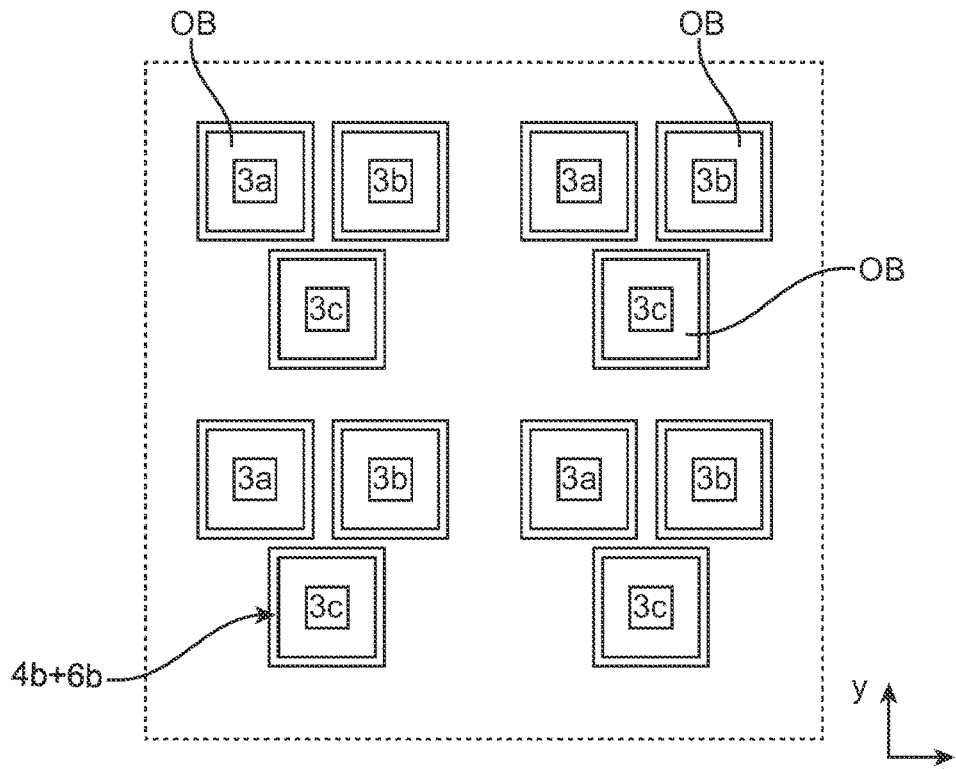
FIG. 8 is an embodiment of a device in a plan view to illustrate further aspects.

FIG. 8 shows an embodiment of a section of a display or illuminant in a top view with a plurality of such arrangements, each forming 4 pixels. This embodiment particularly concerns the shape and arrangement of the reflector structures 4b. Referring to FIG. 8, each sub-pixel comprising an optoelectronic component is individually framed by a reflector structure 4b having a second metal mirror coating 6b. In this example, the distance between reflector structure 4b and the respective optoelectronic component is 2 times the chip edge length. However, other distances are also possible, in particular the subpixel can be surrounded by the reflector structure with a distance of only a few μm.

Each pixel comprises three sub-pixels 3a, 3b and 3c for emission of red, blue and green light. The pixels have the same shape and are arranged in columns and rows. They thus form a section of a display or a module of such a display. In order to avoid visible artefacts during light emission, which can occur due to periodic subpixel arrangement, the subpixels 3a, 3b and 3c can be arranged differently or permuted contrary to the representation shown here. In addition, the shape of the reflector structures 4b is not limited to square footprints.

Figure 9:
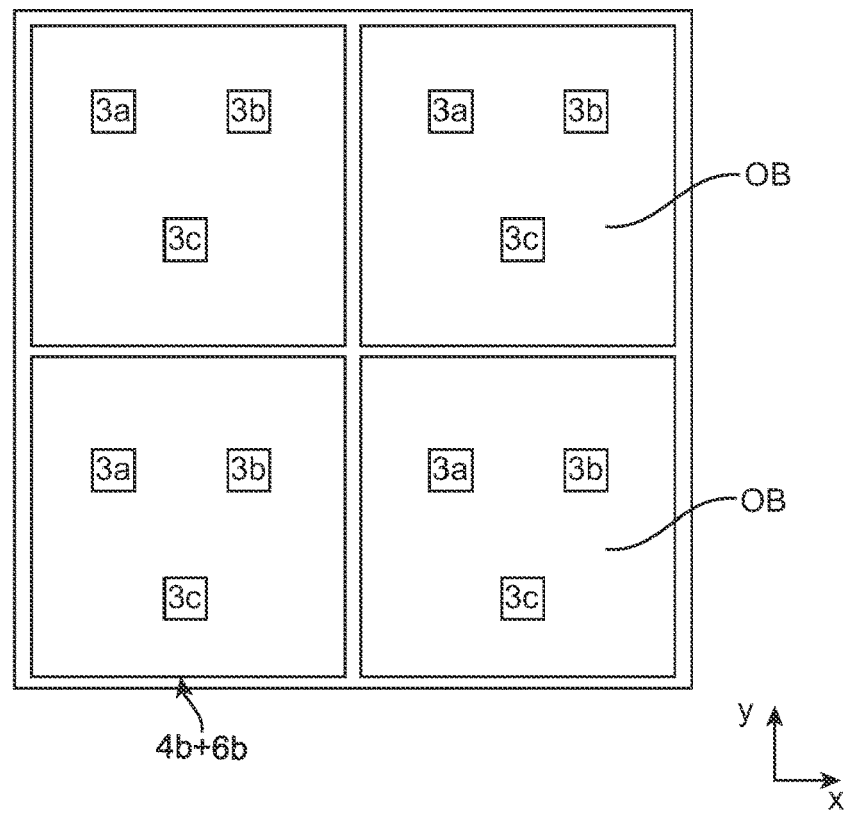
FIG. 9 shows another embodiment of a proposed device in a top view.

FIG. 9 shows a sixth embodiment of a proposed array in a top view. The reflector structures 4b are configured in such a way that they enclose an entire pixel, for example with the optoelectronic components 3a, 3b, 3c. Because of the now different distance, the flank angles of the coated reflector structures 4b are different compared to the embodiment of FIG. 8. Depending on requirements, the flank angle of the centrally arranged reflector structures may also be different from the surrounding frame. It should be noted, however, that in both versions, considerably more such structures are combined and formed as pixels.

FIG. 10 to FIG. 11 show further embodiments of an optoelectronic component and how they can be configured and combined as subpixels.

In FIG. 10, the optoelectronic component is formed with an additional metal mirror layer 6c on the side flank of the bezel 4a. The side flank forms a truncated pyramid and tapers towards the top. The metal mirror layer can also serve as a contact for contact 5. FIG. 11 shows the second embodiment already described. FIG. 12 shows a third embodiment. In this example, the flanks of the reflector structure 4a are also bevelled, but in such a way that the circumference increases with increasing distance from carrier 1. The shape of the flanks and their steepness adjust the extraction of light from the body.

FIG. 13 shows an advanced embodiment based on the third embodiment according to FIG. 12 in a top view. In this example, the second metal mirror layer 6c applied to the reflector structure 4a are surrounded and framed by a black layer 8, in particular a black casting. This may, for example, extend in particular near the substrate 1 at the foot of a reflector structure 4a. In addition, a coating 7 is deposited on the surface for sealing and optical out-coupling. The edge of the μ-reflector structure 4a is covered by a second metal mirror layer 6c. Starting from a contact layer 5, a first metal mirror layer 6a extends in particular in the form of a strip to a second contact region 2b formed on a substrate 1, which may be covered by an optically transparent coating 7 for sealing or encapsulation. As an example, an electrical conductor track 9 is shown to which the second contact area 2b is electrically connected. The metal mirror layers 6a and 6c can have the same material or layer stack.

FIG. 1 shows an embodiment of a proposed method for manufacturing an optoelectronic arrangement OB and an optoelectronic component. The steps shown are applicable to a large number of individual components, so that they can be manufactured together in larger numbers.

In a first step S1, a first contact area 2a and a second contact area 2b is made on one side of a substrate or carrier. The carrier may in turn have circuits or other internal structures. The contact areas can be created by, among other things, patterning a photoresist layer and removing the areas that are not exposed afterwards, so that parts of the substrate are exposed. The contact areas 2a and 2b are then deposited as a metallic layer. A body 3a is also deposited on one of the contact areas. The body 3a comprises two oppositely doped semiconductor layers with an active layer for generating light arranged in between. In some aspects, this body can be manufactured separately and then be transferred onto this area by means of a transfer process. In another aspect, the layers are applied to the surface of substrate 1, structured and thus the bodies are formed.

In a second step S2, a planarization layer 4 is applied to form a reflector structure 4b which completely surrounds the body 3. If necessary, the layer 4 is planarized to be planar with the surface of body 3a. The layer 4 is then structured to create a surround 4' around the body 3. This border essentially extends to the second contact area 2b. In addition, a more distant border 4b is created. The side flanks of the border are bevelled. The slope of the edges can be used to control light extraction or the direction of reflection. In step S4, a contact surface 5 is applied to the surface of the body 3a and adjacent areas. This comprises a transparent but conductive material Finally, in a fifth step S5, an electrically connecting metal mirror layer 6a is applied to the contact layer 5. The metal mirror layer extends over the edging 4a' to the second contact area 2b and contacts it. In addition, a second metal mirror layer 6b is simultaneously applied to the side flanks of the reflector structure 4b. Through structuring and processing, the surface of the surrounding ridge 4 remains free of the metal. In other embodiments, this can also be done differently in order to obtain an electrical connection between the metal mirror layer on both side flanks.

Figure 14:
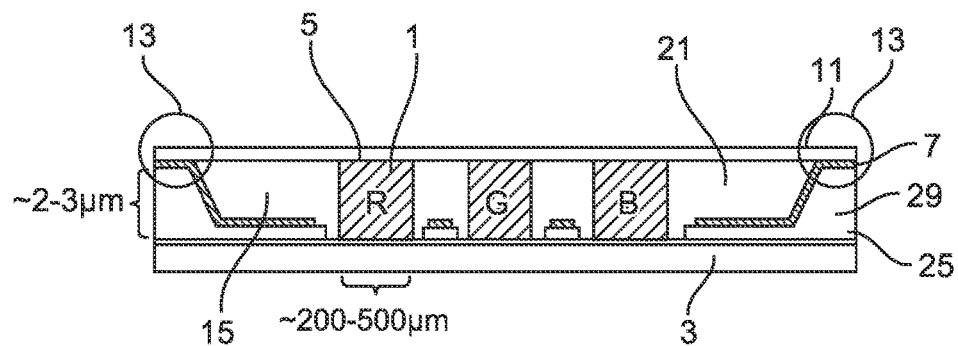
FIG. 14 illustrates an embodiment of an arrangement of three vertical optoelectronic components with a circumferential structure and a cover electrode according to some aspects of the proposed concept for forming, for example, a pixel.

The aspects presented above for a reflecting mirror can also be applied to other designs of optoelectronic components, for example, the following vertical optoelectronic components with circumferential structure. FIG. 14 shows a version of a pixel cell with a common cover electrode and a circumferential structure, which on the one hand allows fast switching times by a suitable current conduction and on the other hand radiates the generated light in a main radiation direction by a mirror coating. The arrangement shown in FIG. 14 comprises three vertical optoelectronic components, a first component 1 providing red light, a second component green light and a third component blue light. The optoelectronic components thus form subpixels of a pixel cell. For simplicity, the individual components are shown in series, but other arrangements are also conceivable, for example in triangular form. Furthermore, the optoelectronic components are of equal size. In one embodiment, the components show an edge length in the range of 200 μm to 750 μm, their height can preferably be between 10 μm and 100 μm, for example. The components are manufactured separately and then transferred to the substrate 3 by means of various transfer processes. This is also due to the simplicity of the embodiment, as the size can also vary depending on the design. However, they should have the same height so that further process steps do not require additional measures. The optoelectronic components have a vertical design, i.e. they have their two contacts on different sides, as shown in the figure on the top and bottom side.

The optoelectronic components are arranged on a common substrate 3. For this purpose, the optoelectronic components are electrically connected with their first contact to a contact not shown here on or in the substrate. The substrate can in turn be a semiconductor substrate or also a backplane or the like. In the substrate the leads are arranged, with which lead to the contacts for the optoelectronic components. In addition to leads, current sources and or drive electronics can also be formed in the substrate. Due to the size of the components, sufficient space is to be provided for this. In some applications, e.g. for luminous applications, measures must also be provided to be able to dissipate any heat that arises. In applications for displays or less power-intensive applications, some of the structures and leads can be designed in TFT technology.

The pixel cell with its three optoelectronic components is embedded in a cavity or surrounded by a border. Such borders can also be seen, for example, in FIGS. 8 and 9. On the left and right side of FIG. 14, elevations 29 are formed on the substrate 3. Such elevations 29 providing a cavity or recesses may for example comprise polyimide or another non-conductive material. They surround the optoelectronic components on all sides and thus form the border of the pixel or other optoelectronic arrangement.

The sidewalls are slightly bevelled and thus run at an angle to the normal of the surface. In addition to the linear course of the side surface shown here, they can also show a parabolic course.

In addition, an additional electrical insulation layer 25 is provided between the generated elevations 29 and the substrate 3 for better mechanical strength. A conductive reflective layer 7 is applied to the insulation layer or the elevation 29. This extends not only over the lateral surface of the elevation 29, but also along a region of the substrate surface and between the optoelectronic components. However, the reflective layer is spaced apart here so that a short circuit or unintentional contact with the tube chips is avoided. In addition, the mirror coating is also provided on an upper side of the elevation in area 13. Mirroring 7 is configured as a metal mirror, which can have Al, Ag and AgPdCu and the same in particular. Other materials can be metals or alloys of Al, Ag, Nd, Nb, La, Au, Cu, Pd, Pt, Mg, Mo, Cr, Ni, Os, Sn, Zn or alloys or combinations thereof.

The space 15 between the elevation or in the cavity and between the optoelectronic component is filled with a transparent, non-conductive material 21 and reaches up to the height of the second contacts 5 of the optoelectronic components. Material 21 forms an insulating layer. The insulation layer can be applied by spin-on glass or similar techniques. Depending on the requirements, the insulating material can then be removed up to the height of the contacts 5 and the reflective layer so that these are exposed and a planar surface is formed. Finally, a transparent, electrically conductive layer is created on the second contact 5 of the components and the insulating layer 21, which provides a cover electrode 11. The transparent layer can have ITO and/or IGZO and the like, for example. Other examples of cover electrode materials are transparent conductive oxides such as metal oxides, zinc oxide, tin oxide, cadmium oxide, indium doped tin oxide (ITO), aluminium doped tin oxide (AZO), $Zn_2SnO_4$, $CdSnO_3$, $ZnSnO_3$, $In_4Sn_3O_{12}$ or mixtures of different transparent conductive oxides.

The cover electrode 11 extends over the entire insulation layer 21 and overlaps with the reflective layer in the areas 13. The large-area direct contact with the underlying metal mirror coating 7 creates a good current coupling, so that the distance that the current must travel through the transparent conductive layer 11 is only short. This means that the generally greater surface resistance of the transparent conductive layer 11 does not have such a great effect. Due to the planar surface to which the cover electrode 11 is applied, the material can be easily sputtered on or applied by means of a "spin-on glass (SOG)" top contact process. This enables a planar coating with the ITO cover electrode 11, so that tear-off edges are avoided, for example during a so-called thermal shock test. However, it is useful in this production process that both the mirror coating 7 and the contacts 5 are exposed and are contacted directly by the material 11.

Figure 16:
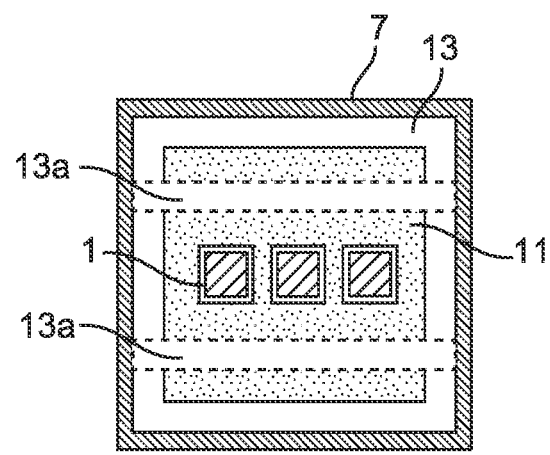
FIG. 16 shows a top view of the device of the previous figure.
Figure 17:
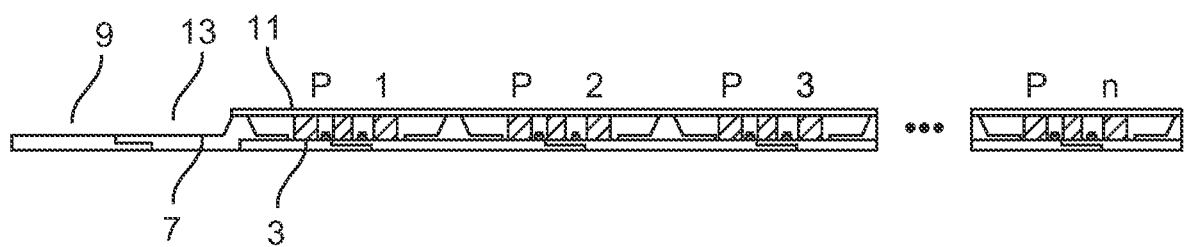
FIG. 17 shows a cross-section of a section of an array with multiple arrangements and a cover electrode.

FIG. 16 shows a top view of the embodiment according to FIG. 14. In the middle of the arrangement the three optoelectronic components are arranged in a row. These are contacted by means of a cover electrode 11, which is electrically contacted in an overlap area 13 with a mirror coating 7 or a metal mirror layer. The border through the elevation or cavity is substantially square. This results in a smaller distance between the two outer optoelectronic components and the elevation. In one embodiment, it may be more appropriate to form the border as a rectangle. This is indicated in FIG. 16 by the dashed areas 13a in which the elevation lies and in which the cover electrode is in contact with the mirror coating. This makes the distance between the optoelectronic components and the border more even.

Figure 18:
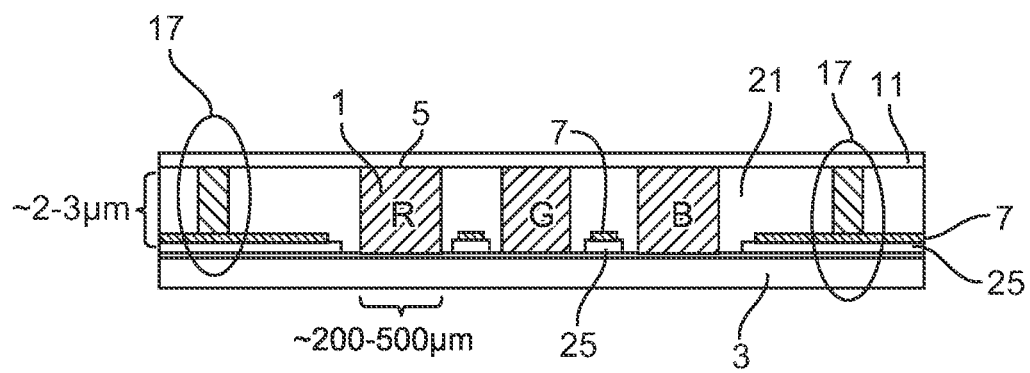
FIG. 18 is a second embodiment of a pixel with multiple optoelectronic components and a transparent cover electrode according to further aspects of the proposed principle.

FIG. 18 shows an arrangement of several pixels P1, P2, P3 . . . Pn arranged along a row. The pixels P are separated from each other by an elevation, so that optical crosstalk is at least reduced. In cross-section, three optoelectronic components 1 are formed for each pixel, which are designed to emit light of different wavelengths during operation. These are fixed and electrically contacted between a substrate 3 and a cover electrode 11. The direct electrical contact of the cover electrode 11 with the mirror coating 7 is formed according to the embodiment shown in FIG. 14.

The mirror coating 7 is electrically connected to the cover electrode 11 on each of the elevations separating the pixels. Outside the pixel cells and the row of pixels, the mirror coating is connected to a leftmost control contact 9 of the substrate 3. The control contact 9 forms a contact area at which further contacting can take place. In other examples, contact 9 is led into the substrate where further circuits and control elements are arranged. Due to the low surface resistance caused by the metallic mirror coating, the total voltage drop across the supply lines is reduced. With a suitably guided current flow, parasitic capacitances are reduced and switching times for driving the optoelectronic components can be effectively reduced. The pixel arrangement shown in FIG. 18 further minimizes optical scattering between pixels and thus so-called optical crosstalk.

FIG. 18 shows a further embodiment of a proposed device. Here, the same reference signs as in FIGS. 14 to 17 show the same features. In this embodiment, no elevation or cavity is provided on the substrate, the mirror coating and the supply line run substantially planar along the surface of substrate 3. Three optoelectronic components 1 are arranged on the substrate 3 and electrically connected to contacts not shown. The mirror coating 7 enclosing the optoelectronic components is electrically separated from the substrate 3 by means of a transparent but electrically insulating layer 25. The components 1 (R, G and B) are surrounded by an insulation layer 21. The layer is transparent and extends in every direction over the substrate up to the height of the contacts 5 of the optoelectronic components. The upper contacts of the optoelectronic components are electrically contacted by a cover electrode 11, which is configured as a transparent ITO cover contact and rests on the insulation layer. Furthermore, several conductive vias are created above the mirror coating 7, the mirror coating 7 is electrically contacted with the cover electrode 11. The vias are filled with a metal to keep the surface resistance low.

In some aspects, the vias are merely openings in the insulation layer. However, trenches or the like can also be provided in the insulation layer, which reach up to mirror coating layer 7. If these are formed at least partially circumferentially around the pixel and then filled with a reflective material, light guidance can be achieved in addition to good current injection. In this design, the height of the optoelectronic components plays a lesser role, provided they are of the same height, since they do not have to be adapted to a cavity or elevation.

Figure 19:
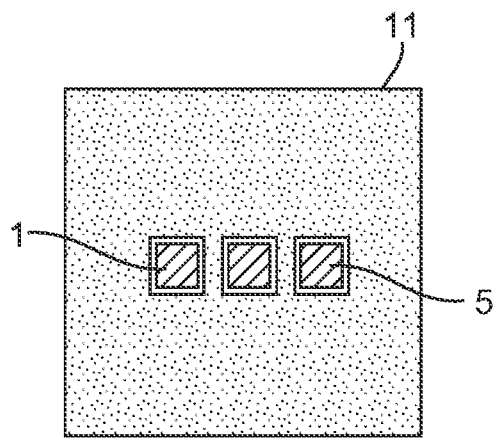
FIG. 19 shows a top view of the embodiment of the previous figure.

FIG. 19 again shows the structure shown in FIG. 18 in plan view. The pixel is designed as a square, so that the distance from the centre raw chip to the edges of the pixel is approximately the same. Reference mark 5 indicates the electrical contacts 5 of the optoelectronic components 1 to the transparent cover electrode 11. Here, too, a mirror coating 7 (not shown) can surround the area around the optoelectronic components.

Figure 20:
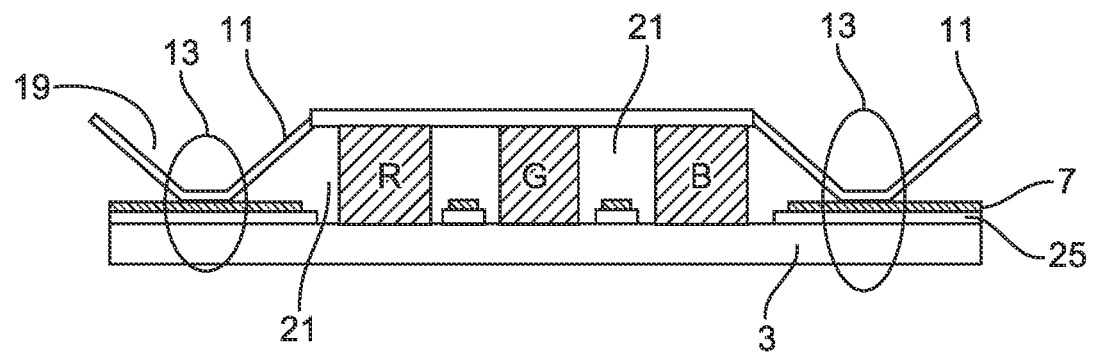
FIG. 20 illustrates a third embodiment of an arrangement in cross-sectional view, which also comprises several optoelectronic components with a transparent cover electrode.

FIG. 20 shows another example of a proposed embodiment in cross-section. According to this example, the cover electrode 11 is configured as an ITO cover contact, which in turn has been applied planar over the contacts 5 of each optoelectronic component R, G, B. An insulation layer 21 surrounds each component. However, the insulation layer has been removed in the edge area of the pixel and has a sloping side edge. This creates an opening 19 that reaches up to the reflective layer 7 and exposes it in a larger, i.e. not only point-shaped, area. The larger this exposed area, the larger is the later contact area with the cover electrode 11.

In other words, the planar isolation layer is removed in the area between two pixels and above the reflective layer 7. This can be done by an etching process, for example with RIE. The created openings 19 have edges 23 with a flat opening angle. After opening, the cover electrode 11 is applied to the insulating layer and thus extends over the planar surface and the side surface of the insulating layer.

Alternatively, a metal layer can be applied to the side surface, which contacts the cover electrode 11 at the upper edge of the insulation layer.

With a thicker insulation layer 21, the opening 19 with its side flank should be designed so that the upper angle is relatively flat, i.e. comparable to an inverted flat cone. The flat bevel angle prevents the ITO layer 11 from "tearing off" at the edge of the openings 19. The same applies to the angle between the side flank and the mirror coating layer 7.

The generated pixel element has such contacts and overlaps at several points, especially all around, so that the subpixel or pixel is also enclosed. In addition, further subsequent layer(s), for example a scattering layer, or clear lacquer layer with different refractive index can be provided in the openings, which in the embodiment, for example, lead to an improvement of the contrast, in which the lateral waveguide of light emitted from the chip side edges can be used for light extraction and does not propagate up to neighboring pixels.

Figure 21:
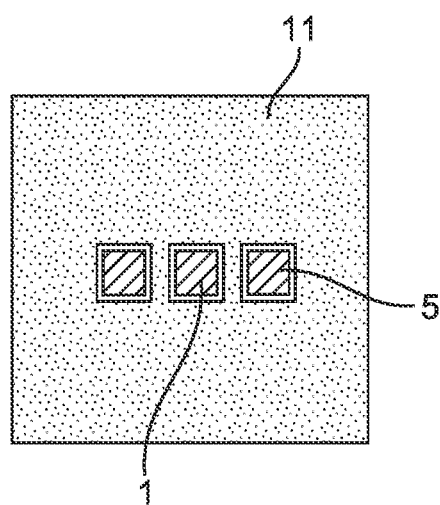
FIG. 21 shows a top view of the embodiment of the previous figure.

FIG. 21 shows a top view of the embodiment according to FIG. 20. Three subpixels, each provided by a micro light emitting diode raw chip 1, have electrical contacts 5 on a side facing away from the substrate 3. These can be electrically coupled to the outside of the pixel by means of a transparent cover electrode 11.

Figure 22:
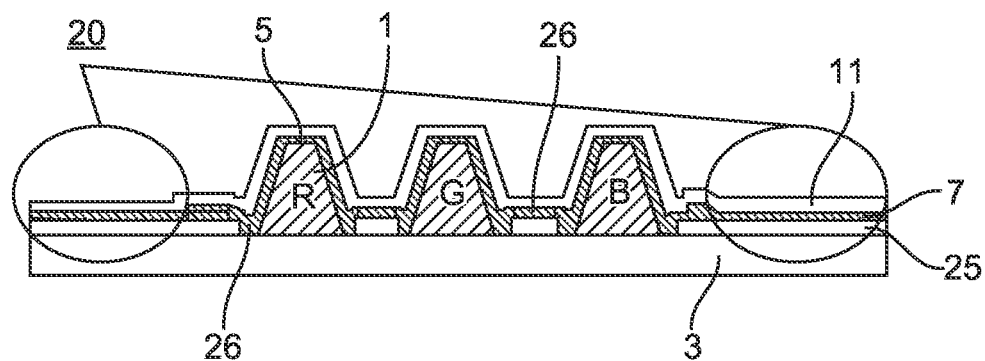
FIG. 22 shows another embodiment of a pixel according to the proposed concept.

FIG. 22 shows a further example of a device. The three optoelectronic components 1 are arranged in series. Each of the components is designed as a truncated pyramid in this embodiment. Its base area decreases slightly with increasing height. Thus, the optoelectronic components show a slightly bevelled side flank.

The surface of the side edges of each of the optoelectronic components 1 is covered with a thin transparent and insulating layer 26. However, this does not extend to the upper second contact 5, so that it is exposed. The inorganic insulating layer 26 can be produced by chemical vapour deposition, for example. Alternatively, the layer 26 can also be produced with ALD-based (Atomic Layer Deposition) layers such as SiNx, SiOx, $Al_2O_3$, $TiO_2$, $HfO_2$, $TaO_2$ and $ZrO_2$. The inorganic layer can also consist of multiple layers, namely ALD-CVD-ALD or CVD-ALD or ALD-CVD. The ALD layer can also intrinsically consist of a multilayer stack (a so-called nanolaminate). Such an ALD nanolaminate would then consist of a multilayer layer stack of e.g. two different ALD layers and ALD materials, whereby, for example, the individual layers are typically only 3 nm-10 nm thick, according to A-B-A-B-A or similar.

In the vicinity of the substrate 3, 25 mirror coatings 7 are applied to electrical insulation layers, which are also formed near the components 1. In sufficient distance to the die chips, openings 20 are formed in the insulation layer 26 on the left and right side of the pixel. This exposes the mirror coating layer 7. Finally, a cover electrode made of the conductive transparent material is applied to the top side and the side edges. This also extends over the openings in the insulating layer 26, and is thus in contact with the metallic layer 7 over a large area. In this way, the direct electrical contact of the cover electrode 11 with the mirror coating 7 can be created.

Figure 23:
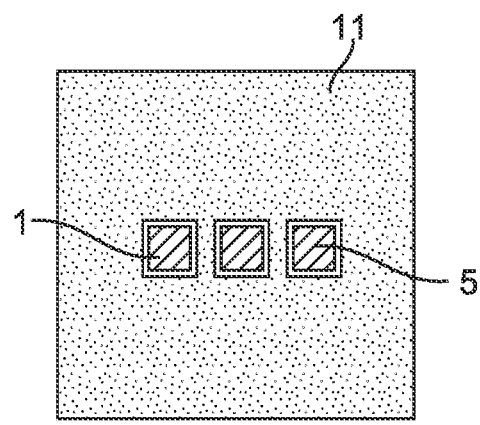
FIG. 23 is a top view of the embodiment of the previous figure.

FIG. 23 shows the arrangement according to FIG. 22 as a top view. According to FIG. 23, three subpixels or optoelectronic components 1 are arranged in such a way that their electrical contacts 5 facing away from the substrate 3 can be electrically contacted by means of a transparent cover electrode 11.

Figure 15:
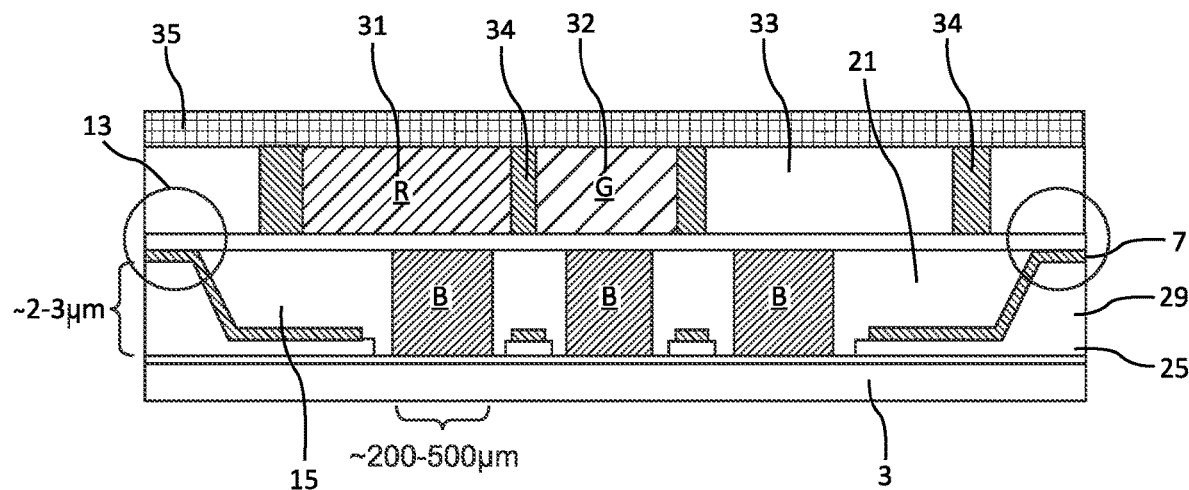
FIG. 15 shows another embodiment similar to FIG. 14 with additional converters and light extraction structures, thus realizing further aspects of the present disclosure.

FIG. 15 presents an embodiment that is provided with additional structures. The arrangement is similar to the design in FIG. 14, although no further explanation is given.

In contrast to that embodiment, however, three optoelectronic components B of the same type are applied to the substrate and electrically contacted. The optoelectronic components B are configured to emit light of a blue wavelength during operation. A structured insulation layer 30 is applied to the cover electrode 11. This improves the decoupling of the light from the optoelectronic components. Since optoelectronic components of the same type are used in this embodiment, the light must be converted into other colours to obtain an RGB pixel.

For this purpose, 30 converter materials are applied to the layer to convert the light into the appropriate wavelength. In detail, this is a first converter layer 31, which is located above the left blue optoelectronic component. A green converter layer 32 is provided above the centrally arranged optoelectronic component. Finally, a further transparent layer 33 is arranged above the right optoelectronic component. This is not necessary in itself, but the transparent layer creates a planar surface. The converter materials contain an inorganic dye or quantum dots. To reduce optical crosstalk, the individual converter layers, or the converter layer 32 from the transparent layer, are separated by a thin reflective layer 34. Although it is possible that light from other components than the component directly below may also enter the converter layer, this can be reduced by a low design or by raising the conductor path structures between the components. In addition, the coupling-out layer 30 can also be structured in such a way that it couples out more light that enters layer 30 at a steep angle, i.e. substantially from below. The pixels here are arranged quite close together. If the distance is slightly greater or the arrangement is different from the one in a row, the converters and reflective layers 31 to 34 can be arranged so that they are evenly distributed over the pixel. This would also place the outermost reflective layers 34 above the elevation.

Above the converter structure there are now one or more further structured layers 35, which (not shown here) also partially extend into the converter structure. The converted light can couple well into the structure 35. The structured layers 35 are used for light collimation and shaping, so that converted or unconverted light exits substantially steeply, i.e. preferably at perpendicular angles to the substrate surface. The structured layers 35 can, for example, have a photonic structure that provides a virtual bandgap for light propagating parallel to the surface. This collimates the light.

Several of the pixels shown here can be arranged in columns and rows to form, individually controllable, a display or display array. A pixelated light array, for example for motor vehicles, can also be created with these arrangements.

Figure 24:
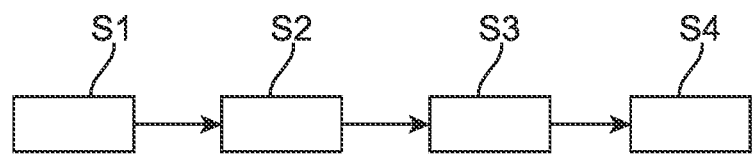
FIG. 24 is a process sequence with various steps for producing a pixel according to the proposed principle.

FIG. 24 shows an embodiment of a method for manufacturing an optoelectronic arrangement. In a first step S1, a substrate with a number of contacts on its surface is provided. The substrate may include further leads, drive or switching elements as described above. In one aspect, an elevation may be created on the substrate that surrounds the optoelectronic components to be subsequently mounted, thereby optically separating an arrangement from adjacent elements.

In step S2, one or more optoelectronic components are now mounted on the substrate and electrically connected with their first contacts to contacts on or in the substrate. The optoelectronic components are designed in a vertical configuration, i.e. their contacts are on opposite sides. The optoelectronic components can be arranged in series, but other arrangements are also possible.

In step S3, a mirror coating layer is deposited on the substrate surface, which is electrically connected to an electrical control contact on the surface of the substrate and at least partially covers the surface. The mirror coating layer can be applied at least partially to the sidewalls of the elevation or cavity, in particular those facing the optoelectronic components. Finally, in step S3 a transparent cover electrode is placed on the further contact, which electrically contacts the mirror coating.

In order to prevent the cover electrode from being torn off, step S2 or S3 also provides for the optoelectronic components to be surrounded by an insulating layer after the mirror coating has been applied or the optoelectronic components have been attached. The height of this insulating layer corresponds to the height of the optoelectronic components, so that a planar surface is created. The generation of the insulating layer is done with the measures disclosed here to create a transparent non-conductive layer, such as spin-on glass or similar. A planar surface is created by removing the insulating layer back to the upper contacts of the optoelectronic components and the mirrored layer. This step can involve mechanical or chemical techniques. The cover electrode is then applied to the transparent insulating layer.

Contacting can take place in an overlapping contact of the cover electrode surface and a mirroring surface in the area of the elevation or at the end of the cavity facing away from the at least one component. Alternatively, a series of vias can be provided in the insulating layer, which when filled with metal creates a connection between the cover electrode and the mirror coating. The vias can also be trenches, which expose the mirror coating.

In further steps, one or more structured layers can be deposited on the cover electrode, which comprise a photonic crystal or quasi-crystal structure and are configured to suppress or reduce light that radiates parallel to a surface of the substrate. Alternatively, the cover electrode itself can be patterned to either improve light extraction, collimate light or emit light directed away from the substrate surface. Finally, the application of converter material over the optoelectronic components is possible.

The following aspects deal with a different point of view in contrast to a direct improvement of the directionality of the emitted light. The following examples are intended for the creation of a Lambert radiator. However, it is known by the expert that other shapes on reflector elements influence the beam-shaping. Special designs thus create an arrangement with rear decoupling which can be directed at the same time.

Figure 25:
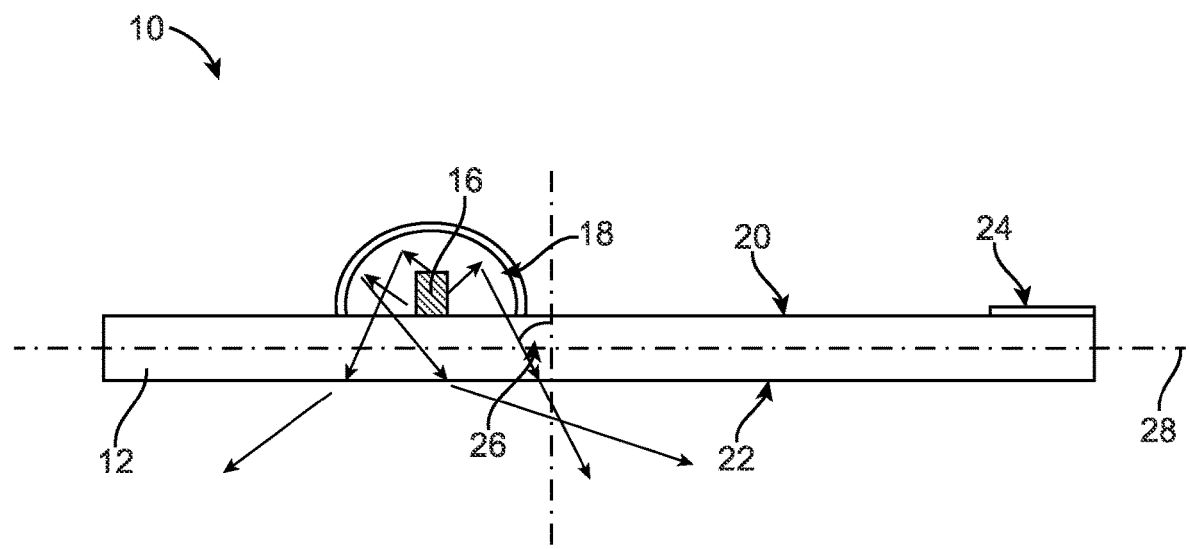
FIG. 25 illustrates an optoelectronic arrangement with a spherical reflector element and control electronics according to some aspects of the proposed concept.

FIG. 25 shows an embodiment of an optoelectronic arrangement 10 with a reflector element 18 according to the invention. First of all, a carrier substrate 12 is also provided here, which often has a plurality of optoelectronic components 16 arranged next to one another on a assembly side 20 of the carrier substrate 12. On the carrier substrate 12, drive electronics 24 are usually provided which serve to control the individual optoelectronic components 16. For this purpose, electrically conductive connections (not shown) may be provided between the control electronics 24 and the individual optoelectronic components 16. In other cases, as shown below, the carrier substrate can also be transparent or have other structures for reshaping the light.

The reflector element 18 here is designed like a dome and surrounds the optoelectronic component 16 at least on the side where the optoelectronic component 16 emits light 14. For example, if the component 16 emits light 14 in a direction away from the carrier substrate 12, this light hits a surface of the reflector element 18 directed towards the optoelectronic component 16, is reflected there and returned towards the assembly side 20 of the carrier substrate 12. If necessary, the light propagates with refraction at the interface of the assembly side 20 over a cross section of the carrier substrate 12 in the direction of a display side 22 of the carrier substrate 12 and is coupled out there, if necessary with repeated refraction or diffraction.

The reflector element 18 should suitably have shapes and properties that light 14 is incident at an angle of incidence 26 as perpendicular as possible relative to a carrier substrate plane 28 on the assembly side 20 of the carrier substrate 12. Among other things, this should serve to minimize losses due to total reflection within the carrier substrate 12 as well as unfavourable angles when decoupling from display side 22 of carrier substrate 12. This angle of incidence 26 should be as small as possible, also to minimize crosstalk between adjacent pixel elements 10.

Figure 26:
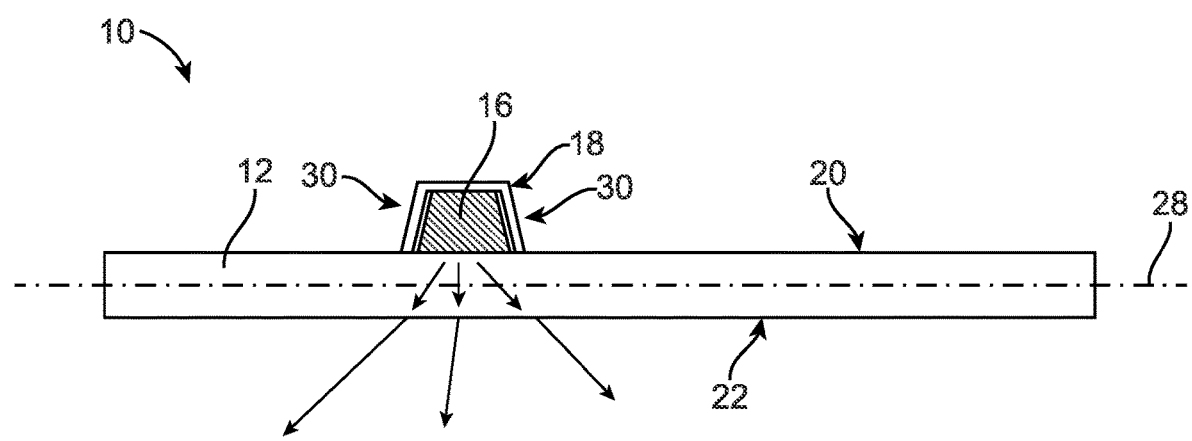
FIG. 26 shows a second embodiment of an optoelectronic arrangement with a reflector element designed as a layer and a passivation layer according to some aspects of the proposed concept.

FIG. 26 shows another example of an arrangement 10 according to the invention in the form of a pixel element with a reflector element 18 implemented as a layer on or around an optoelectronic component 16. This embodiment may suitably allow the reflector element 18 to be processed, for example as a metallic layer, directly onto a surface of the component 16. Various materials can be used for the reflector element 18, such as metallic materials, metal alloys or oxides or other suitable compounds that can be applied using the available manufacturing processes. A similar embodiment is provided by forming the optoelectronic component directly from the same material as the carrier substrate. In addition, the reflector element has a specific shape and design. However, the various aspects of the preceding figures may be combined with, among other things, embodiments shown in FIGS. 25 to 26 and disclosed herein. For example, the reflector element 18 may be replaced with an embodiment of reflective circumferential applied layers. The carrier substrate is thus deposited on the cover electrode.

In addition, a passivation layer 32 is provided at the mesa edges 30 between the component 16 and the layer of the reflector element 18. This passivation layer 32 has light-absorbing or at least light-blocking properties so that light 14 emitted by the optoelectronic component in the direction of the carrier substrate plane 28 or in the direction of the mesa edges 30 is attenuated or absorbed. This is to prevent light 14 from passing over in the direction of an adjacent element 10 and causing crosstalk. In addition, the passivation layers 32 can be configured to cause beam-shaping of the emitted light 14.

Figure 27:
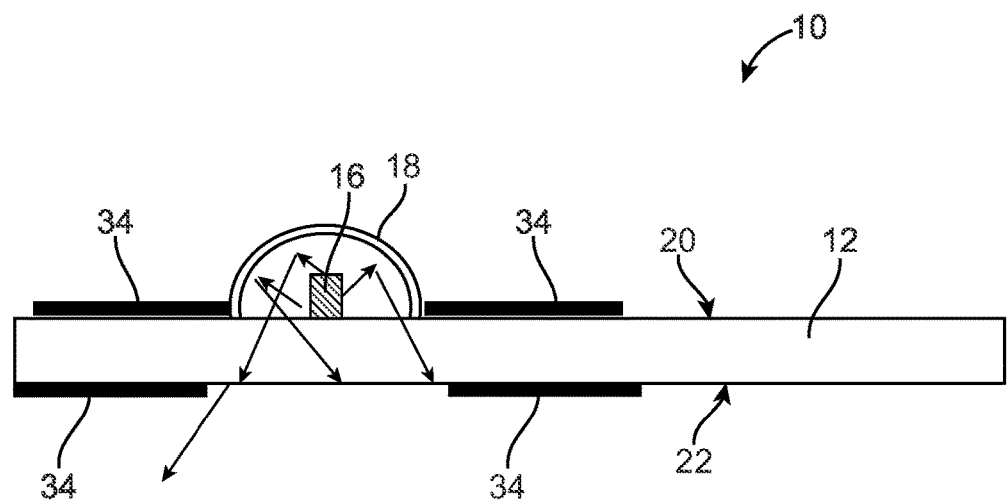
FIG. 27 shows a third embodiment of an optoelectronic arrangement with light-absorbing coatings on a display side and an assembly side of the carrier substrate according to some aspects of the proposed concept.

FIG. 27 shows a pixel element according to the invention with light-absorbing coatings 34 on a display side 20 and an assembly side 22 of the carrier substrate 12. This embodiment features a spherical reflector element 18 surrounding an optoelectronic component 16, which is arranged on the assembly side 20 of the carrier substrate 12. According to this aspect, the carrier substrate 12 is adapted to be transparent or at least partially transparent so that light 14 can propagate within the carrier substrate 12.

In order to improve the dark impression and contrast of a display, light-absorbing layers 34 are provided according to this embodiment, which are applied here outside the reflector element 18 on the carrier substrate 12 on the assembly side 20 and/or on the display side 22. On the one hand, this can prevent light 14 from being coupled out outside a desired active area of the pixel element. On the other hand, an advantageous effect can be that light 14, which propagates inside the carrier substrate 12, is not coupled out outside the desired area on display side 22, but is absorbed or attenuated. For an observer, the light-absorbing layers 34 can be recognized as clearly inactive or black or dark, and due to the better optical demarcation compared to the active luminous areas, improved contrast properties of a display can be achieved.

Figure 28:
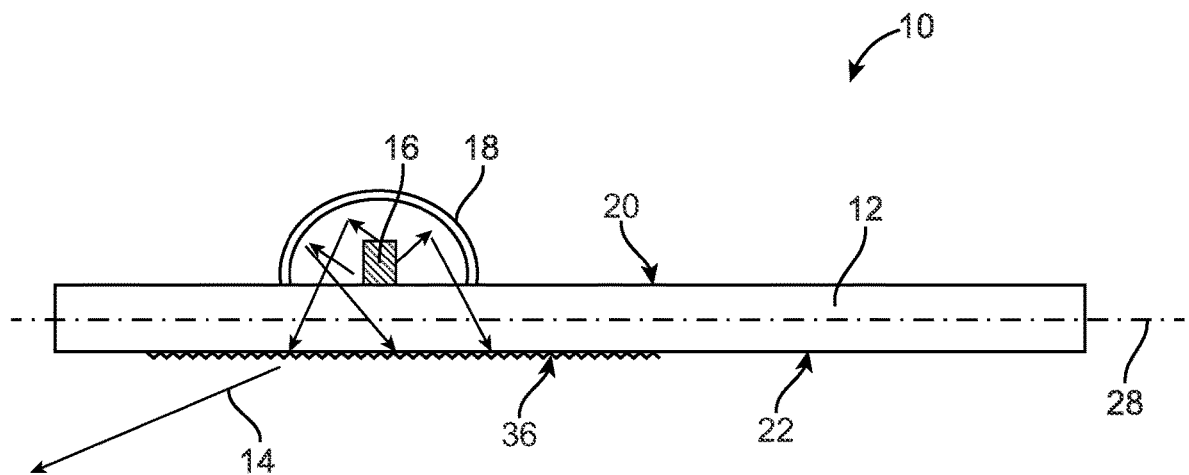
FIG. 28 illustrates an optoelectronic arrangement as a pixel element with a roughened display side of the carrier substrate.

FIG. 28 illustrates in a simplified manner a further embodiment of an arrangement 10 according to the invention. In its basic structure, the arrangement 10 corresponds to the examples already shown in FIG. 25 to FIG. 27. Here, an optoelectronic component 16 is provided on a carrier substrate 12, which is surrounded by a reflector element 18. By reflecting the light 14 at the reflector element 18, light 14 propagates through the carrier substrate 12 and reaches a display page 22 of the carrier substrate 12.

Here it is desirable that as much of the light 14 that has passed through carrier substrate 12 is coupled out of carrier substrate 12 via display screen 22. Here, a roughened surface 36 can cause an improved out-coupling of light 14. More generally speaking, the surface of the display side 22 comprises a structuring, which has additional microstructures at an angle to each other which deviate in their angle from the alignment parallel to a carrier substrate plane 28 and can thus cause additional out-coupling.

Figure 29:
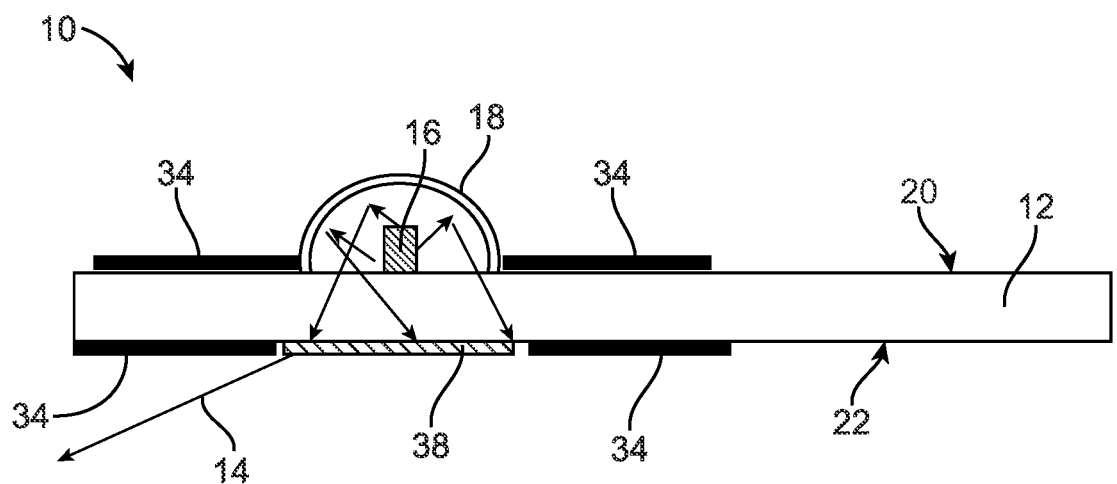
FIGS. 29 and 30 are embodiments based on some of the aspects revealed here, with light absorbing layers to minimize crosstalk and a colour filter element on the display side of the carrier substrate.

FIG. 29 shows an arrangement 10 according to the invention with a colour filter element 38 on the display side of the carrier substrate 12 and light-absorbing coatings 34. This embodiment is suitable, for example, for generating a white or other coloured light, for example in a light source of a motor vehicle.

While the basic structure of the arrangement 10 corresponds to a large extent to that of the previous figures, light-absorbing coatings 34 are also provided here, which are provided both on an assembly side 20 and on a display side 22 of the carrier substrate 12 outside an area of the reflector element 18. In addition, a colour filter element 38 is provided here, which is arranged on the display side 22 of the carrier substrate 12 opposite the reflector element 18.

For example, a red optoelectronic component can be provided with a corresponding red colour filter element 38. The same applies analogously to green colour filter elements 38 together with green components and, for example, to blue colour filter elements 38 together with blue LEDs and the respective emitter chips 16. The advantages here are lower reflectivity and an improved black impression. Here, too, the light-absorbing layers 34 absorb unwanted light components 14 that propagate within the carrier substrate 12.

In an alternative embodiment, again referring to FIG. 29, the element 38 may also be a colour converter element for converting light of a first wavelength to a second wavelength. Light emitted from the optoelectronic component 16 and reflected by the reflector element 18 is incident on the converter element where it is converted. The basic colours or white light can be produced in this way by using different converter dyes.

Figure 30:
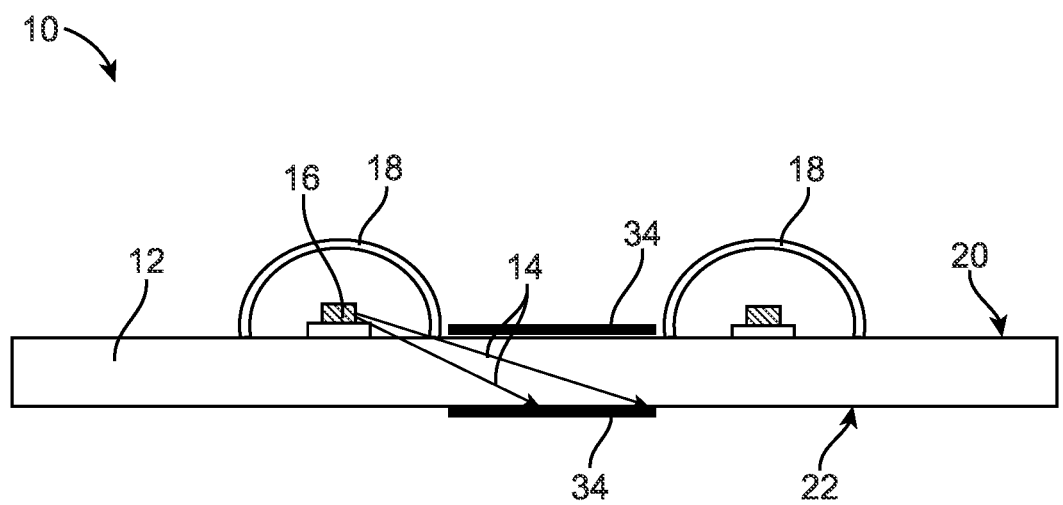

FIG. 30 shows another embodiment of an array, where two adjacent arrangements 10 are placed on the carrier substrate. Between these two pixel elements, light absorbing layers 34 are provided on the different surfaces of the carrier substrate. This can be used in particular to minimize crosstalk. Depending on the arrangement and design of the component 16, there is a gap between the component 16 and the surrounding reflector element 18, which can act as an aperture or aperture edge. This can mean that light 14 emerges through this aperture at a small angle relative to the carrier substrate plane 28 and can pass through the carrier substrate 12 at an angle in the direction of the adjacent pixel element 10.

To prevent this crosstalk, light-absorbing layers 34 are provided between the two arrangements 10 and between the two adjacent reflector elements 18, respectively. These can be arranged on an assembly side 20 of the carrier substrate 12, but also on a display side 22 of the carrier substrate 12. The light-absorbing layers 34 attenuate or eliminate the then unwanted light components 14 and can thus improve the contrast of a display.

Figure 31:
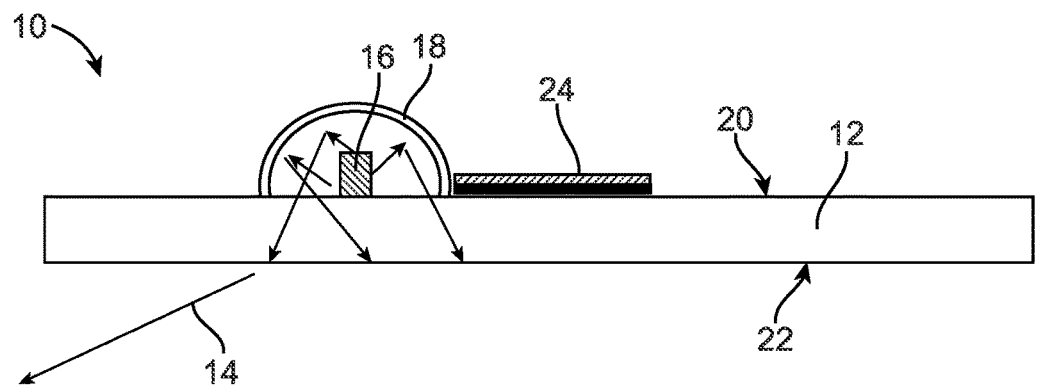
FIGS. 31 and 32 show exemplary embodiments of an optoelectronic arrangement with IGZO- or LTPS-based drive electronics on the assembly side of the carrier substrate and optional diffuser layer according to some aspects of the proposed concept.

In FIG. 31, reference is made to the aspect of the drive electronics 24 of an arrangement according to the invention in the form of a pixel element 10. This is adapted as part of a carrier substrate, for example transistor structures being part of the carrier substrate. In one example, the substrate 12 is provided as the carrier substrate. If an electronic control unit 24 is designed on the basis of IGZO, it is also conceivable according to an example that the electronic control unit 24 can be arranged within an inner area of a reflector element 18 (not shown here). This possibility is based in particular on the at least partial light transmission of the IGZO material. According to another example, 24 LTPS is used as the basis for the control electronics 24 and LTPS as the material for the carrier substrate 12. LTPS stands for Low Temperature Poly Silicon and can have better electrical properties than IGZO, but with more light absorbing properties.

Various materials can be used for the substrate 12, such as amorphous silicon, but also IGZO or LTPS. IGZO stands for indium gallium zinc oxide and has partially transparent properties for light and is comparatively inexpensive to manufacture.

LTPS can be used for both p-transistors and n-transistors, whereas IGZO is only suitable for p-transistors. An arrangement of the control electronics 24, based on LTPS, must therefore be provided here outside a reflector element 18. A further alternative can be seen in the use of so-called ICs. These are often used together with silicon-based substrates and usually have light-absorbing properties.

However, the reflector structure can also be part of a substrate (not shown here), so that this then contains the drive elements. In this context, the component 16 would then be embedded in a cavity whose side walls form the reflector element 18.

According to one example, an arrangement of the drive elements would be outside an area of a reflector element 18 above the reflector 18 or at least outside and, as seen from the substrate 12, on or above the side 20. Contacting of the emitter chip 16 can be achieved, for example, via a metallic contact pad on the carrier substrate 12 or via transparent ITO (indium tin oxide).

Figure 32:
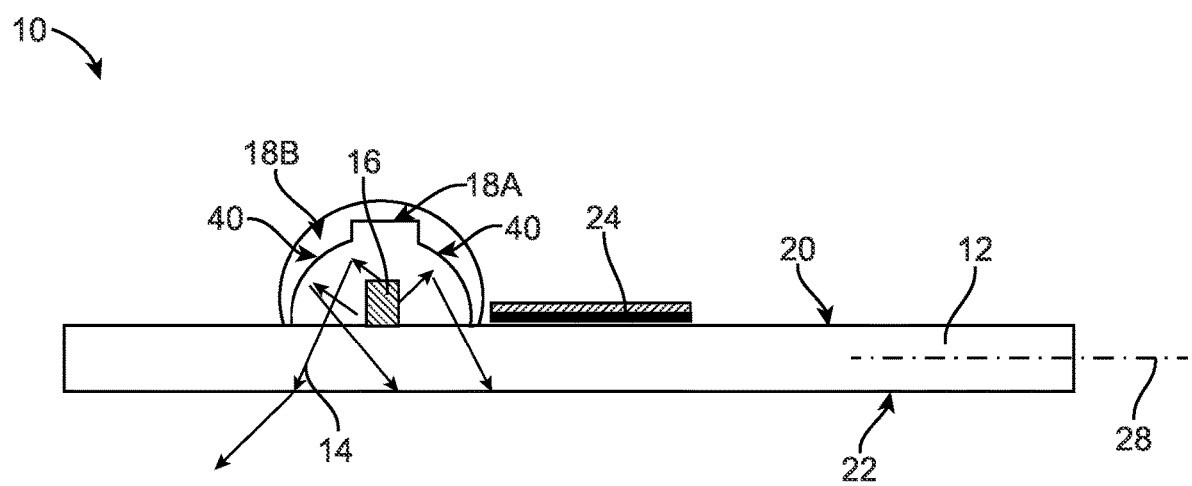

FIG. 32 shows an arrangement 10 according to the invention with a partial coating of a diffuser layer 40 on the reflector element 18. The special feature of the arrangement 10 shown in this embodiment can be seen in a special embodiment of the reflector element 18. Here, a diffuser layer 40 is provided on the lateral inner surfaces of the reflector element 18 (here especially the area 18B). This diffuser layer 40 is intended to cause an increased deflection of the emitted light 14 and a more advantageous deflection of the light 14 in the direction of the carrier substrate 12. It can be advantageous here to provide a thinner or completely missing diffuser layer 40 in an area 18A of the reflector located vertically directly above the emitter chip.

In particular, this diffuser layer 40 can be made flat or even in this area 18A in order to focus the most direct possible back reflection of light emitted transversely to the carrier substrate plane 28 approximately vertically in the direction of the placement side 20 of the carrier substrate 12.

A relatively thin diffuser layer 40 can be sufficient for this purpose, since optoelectronic components, due to their properties and construction, come closer to a Lambertian radiation pattern than previous LED technologies. Materials that can be used for this purpose include $Al_2O_3$ or $TiO_2$.

Figure 33:
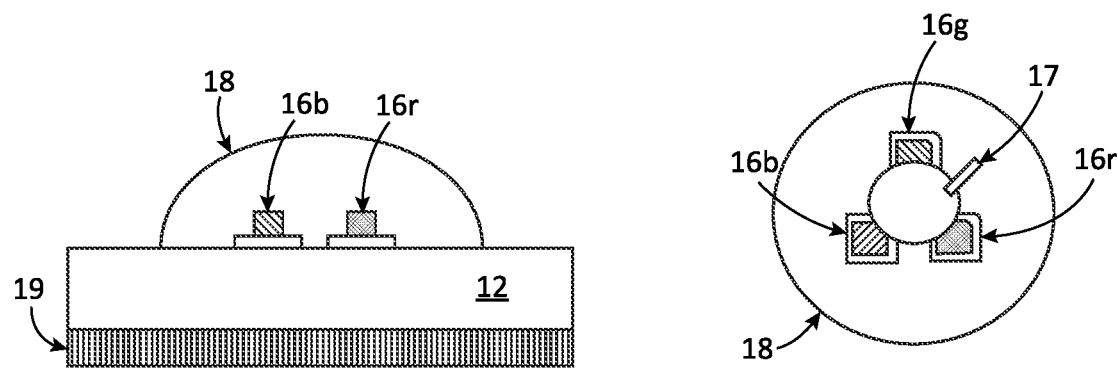
FIG. 33 shows a cross-section and top view of a cell with three optoelectronic components of different colours and a reflector element.

FIG. 33 shows another embodiment in the form of a pixel cell in cross-section and top view. The pixel cell comprises three individual optoelectronic components 16r, 16g and 16b. These are designed to emit the respective basic colours red, green and blue during operation. In this embodiment, the three optoelectronic components are arranged in the corners of a right-angled triangle. However, other arrangements are also possible, for example in a row. Each component is adapted as a vertical LED, i.e. a common contact is located on the side of the LEDs facing away from the carrier substrate. The optoelectronic components can be individually controlled, for example. Other designs are also conceivable, for example as individual display or illuminant modules with or without redundancy. In the illustration on the right, a common transparent cover contact 17 is provided for this purpose, which either completely or at least partially covers the optoelectronic components and thus makes electrical contact. The sidewalls of the optoelectronic components are insulated and are not connected to the cover electrode 17. In addition, a reflector element 18 is provided which surrounds each of the three optoelectronic components and thus forms a complete pixel.

Light, which is thus emitted in the direction of the reflector element, is reflected by the carrier substrate where it hits a photonic structure 19, which is partly incorporated in the carrier substrate. The photonic structure 19 is designed to redirect the emitted light and emit it as a collimated light beam.

The photonic structure can also be omitted depending on the application. For automotive applications, a Lambertian radiation pattern may be more desirable, in which case it is omitted. In the field of Augmented Reality a strong directionality may be desired, which is achieved by the additional photonic structure. In addition to the photonic structure, a converter material can also be provided in addition to the structure or alternatively. In the automotive sector, such directional light applications with white or other coloured light are possible.

Figure 34:
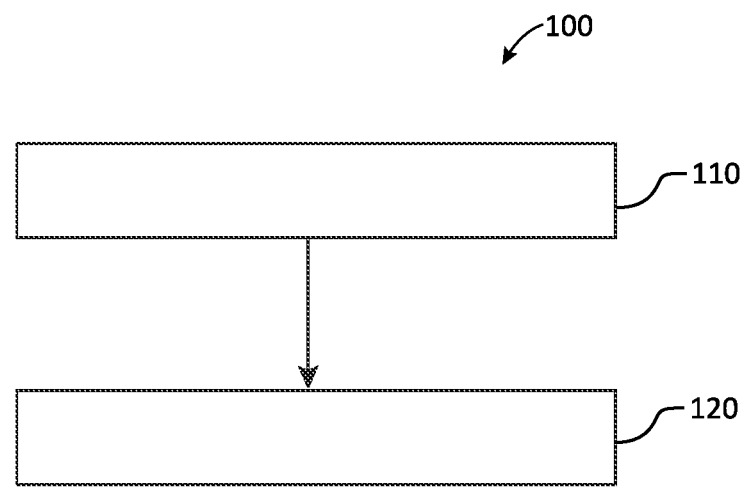
FIG. 34 shows a method of manufacturing an optoelectronic arrangement according to the previous embodiments.

Finally, FIG. 34 shows a method 100 for manufacturing an arrangement 10. First, one or more optoelectronic components are attached to one side of a flat carrier substrate. The attachment is preceded by a corresponding transfer. Details are disclosed in this application.

This is followed in step 120 by creating a reflector element, for example as a reflective layer of the component. According to an example, before step 110, a display side 22 of the carrier substrate 12 is processed to produce a roughening 36 or rough structuring of the surface of the display side 22.

In the following, various devices and arrangements as well as methods for manufacturing, processing and operating as items are again listed as an example. The following items present different aspects and implementations of the proposed principles and concepts, which can be combined in various ways. Such combinations are not limited to those listed below:

1. Method for manufacturing at least one optoelectronic arrangement, comprising the following steps:
   generating a first contact area and a second contact area on a surface of a substrate 1;
   providing a vertical optoelectronic component which first contact is connected to the first contact area;
   generating a reflector structure on the substrate surrounding the optoelectronic component at a distance;
   generating a first metal mirror layer such that the first metal mirror layer electrically connects a contact layer attached to a second contact of the optoelectronic component to the second contact region;
   generating a second metal mirror layer facing the optoelectronic component on the circumferential reflector structure.

2. Method according to item 1, further comprising a
   applying of a planarization layer to form the reflector structure,
   optional removal of the planarization layer over the second contact area, so that it remains openly accessible for the first metal mirror layer.

3. Method according to item 2, comprising
   structuring the planarization layer to form the reflector structure, which mechanically encloses the optoelectronic component in a contacting manner;
   applying of the electrically connecting first metal mirror layer additionally to the reflector structure, in particular electrically conductive to the second metal mirror layer.

4. Method according to item 3, in which the enclosure frames the light-emitting body at a distance, in particular greater than twice the edge length of the optoelectronic component.

5. Method according to item 3, comprising
   applying of the second metal mirror layer on the main surface of the reflector structure facing away from the substrate.

6. Method according to any one of the preceding items, characterized by
   applying of the second metal mirror layer on edges of the reflector structure.

7. Method according to item 6, in which a light extraction is adjusted by an angle of inclination of the edges of the reflector structure.

8. Method according to item 7, comprising a
   generating the edges of the reflector structure in such a way that the circumference of the reflector structure increases with increasing distance from the substrate; or
   generating the edges of the reflector structure in such a way that the circumference of the reflector structure decreases with increasing distance from the substrate.

9. Method according to any one of the preceding items, further comprising:
   applying a black layer, in particular an encapsulation layer, to the substrate, between edges of reflector structures, in particular up to the height of the edges.

10. Method according to any one of the preceding items, further comprising:
    applying and optional structuring of a coating for sealing, encapsulation and/or optical decoupling to the substrate or to the black layer, in particular up to a height above the first metal mirror layer.

11. Method according to any one of the preceding items, in which the layers are structured in the middle by means of photolithography.

12. Optoelectronic arrangement comprising:
    a substrate with a first contact area and a second contact area;
    at least one vertical optoelectronic component, wherein a first contact of the vertical optoelectronic component is connected to the first contact area on one side of a substrate; and a first contact of the vertical optoelectronic component facing away from the substrate is connected to the second contact area by means of a transparent contact layer and a first metal mirror layer; a reflector structure surrounding the vertical optoelectronic component, wherein a second metal mirror layer is attached to the reflector structure.

13. Optoelectronic arrangement according to item 12, wherein the reflector structure encloses the vertical optoelectronic component in a mechanically contacting manner along the X-Y plane, and in particular the first metal mirror layer is electrically conductive to the second metal mirror layer.

14. Optoelectronic arrangement according to item 12 or 13, characterized by an enclosure which encloses the vertical optoelectronic component in a mechanically contacting manner, and the reflector structure frames the enclosure at a distance, in particular between 1 and 10 times, in particular greater than three times, the edge length of the vertical optoelectronic component, the first metal mirror layer and the contact layer additionally being attached to the enclosure.

15 Optoelectronic arrangement according to any one of the preceding items, in which three optoelectronic components each form a subpixel of a pixel.

16. Optoelectronic arrangement according to any one of the preceding items, in which the transparent contact layer is a transparent cover electrode extending over the vertical optoelectronic component to a top surface of the reflector structure.

17. Optoelectronic arrangement according to any one of the preceding items, further comprising a converter material disposed at least partially over the vertical optoelectronic component.

18. Optoelectronic arrangement according to any one of the preceding items, further comprising a light-shaping structure, in particular a microlens or a photonic structure having first and second regions of different refractive indices, which
is applied to the transparent contact layer; or
is arranged between the transparent contact layer and the optoelectronic component; or
one of the first and second regions extends at least partially into or is formed by the semiconductor material of the vertical optoelectronic component or is formed by the converter material.

19. Optoelectronic arrangement according to any one of the preceding items, in which a cavity is formed by the circumferential reflector structure, in which cavity the vertical optoelectronic component is arranged and a remaining space in the cavity is filled with a converter material, in particular of quantum dots.

20. Optoelectronic arrangement, in which an area between the circumferential reflector structure and the vertical optoelectronic component is at least partially covered with a reflective layer.

21. Optoelectronic arrangement, in which the optoelectronic component has a lower height than the surrounding structure.

22. Device comprising a plurality of optoelectronic arrangements according to any one of the preceding items or which have been manufactured according to any one of said methods and are arranged in rows and columns combined in a pixel array, wherein a plurality of pixels are each surrounded by the reflector structure whose side walls are bevelled and provided with a metal mirror layer.

23. Pixel with an optoelectronic arrangement according to any one of the preceding items with three vertically configured optoelectronic components, which are arranged on a carrier substrate and surrounded by a reflector structure.

24. Use of an optoelectronic arrangement according to any one of the preceding items in a video wall or a lighting means, in particular in a motor vehicle.

25. Optoelectronic arrangement comprising a substrate and at least one optoelectronic component fixed to one side of the substrate,
which has a first electrical contact on a side facing the substrate
which has, on a side facing away from the substrate, a second electrical contact which is electrically connected by means of a mirror coating to an electrical control contact on the surface of the substrate, and
wherein the mirror coating at least partially covers the substrate surface facing the at least one component.

26. Optoelectronic arrangement according to item 25, further comprising
a transparent cover electrode, which extends over the second electrical contact and connects it to the mirror coating, the mirror coating being arranged at least partially below the cover electrode and spaced therefrom.

27. Optoelectronic arrangement according to any one of the items 25 and 26, in which the control contact is not located below the cover electrode, and the mirror coating at least one area is not located below the cover electrode.

28. Optoelectronic arrangement according to any one of the preceding items, in which the mirror has a metal mirror, in particular comprising at least one of the following metals: Al, Ag, AgPdCu, Nd, Nb, La, Au, Cu, Pd, Pt, Mg, Mo, Cr, Ni, Os, Sn, Zn and combinations of the above.

29. Optoelectronic arrangement according to any one of the preceding items, wherein
the cover electrode has an electrically conductive oxide layer, in particular a material comprising IGZO, metal oxides, zinc oxide, tin oxide, cadmium oxide, indium-doped tin oxide (ITO), aluminium-doped (AZO), $Zn_2SnO_4$, $CdSnO_3$, $ZnSnO_3$, $In_4Sn_3O_{12}$ or mixtures of different transparent conductive oxides.

30. Optoelectronic arrangement according to any one of the preceding items, wherein the substrate comprises a border at least partially surrounding the at least one optoelectronic component, on the upper side of which border the mirror coating is arranged, which there is electrically connected to the cover electrode surface.

31. Optoelectronic arrangement according to any one of the preceding items, wherein the substrate has a cavity in which the at least one optoelectronic component is disposed, the cavity having a depth substantially corresponding to a height of the at least one optoelectronic component.

32. Optoelectronic arrangement according to any one of the preceding items, in which an insulating planar isolation layer is provided around the at least one optoelectronic component, the height of which is substantially less than or equal to a height of the optoelectronic component.

33. Optoelectronic arrangement according to any one of the preceding items, in which the insulating planar insulation layer extends, at least in part, between the cover electrode layer and the mirror coating layer, in particular above the substrate between the optoelectronic component and the circumferential border.

34. Optoelectronic arrangement according to any one of the preceding items, in which mirroring extends at least partially on a side surface of the border facing the optoelectronic component, and the side surface extends in particular at a bevelled angle to the surface of the substrate.

35. Optoelectronic arrangement according to any one of the preceding items, wherein the direct electrical contact of the cover electrode with the mirror coating is provided by means of a through-plating or a via of the mirror coating material through the insulation layer.

36. Optoelectronic arrangement according to any one of the preceding items, wherein the insulation layer is bevelled at a distance from the optoelectronic component in at least one region and the cover electrode extends there in the direction of the mirror coating.

37. Optoelectronic arrangement according to items 36, in which the edges of the bevelled region have a flat pitch angle.

38. Optoelectronic arrangement according to any one of the preceding items, in which the first contact of the optoelectronic component is directly connected to a contact on a surface of the substrate.

39. Pixel comprising an optoelectronic arrangement according to any one of the preceding items, in which a red, green and blue light-providing optoelectronic component is fixed on the substrate, the second electrical contacts of which are connected to the conductive reflective layer via a transparent conductive cover electrode.

40. Pixel according to item 39, in which the optoelectronic components are surrounded by a common border or are arranged in a common cavity.

41. Pixel according to any one of the preceding items, in which areas on the substrate between the optoelectronic components are at least partially covered with a reflective layer, in particular the mirror layer.

42. Pixel according to any one of the preceding items, in which the optoelectronic components are embedded in a transparent and non-conductive material.

43. Pixel according to any one of the preceding items, wherein the substrate has leads configured to individually control each of the optoelectronic components.

44. Pixel according to any one of the preceding items, in which the substrate comprises TFT structures and electrical leads for individual power supply of each optoelectronic component.

45. Pixel according to any one of the preceding items, further comprising a light-shaping patterned layer on or in the transparent cover electrode, which has a lenticular element, a photonic crystal or a quasi-crystal structure and is adapted to suppress or reduce light emitted parallel to a surface of the substrate.

46. Pixel according to any one of the preceding items, in which the transparent cover electrode is structured, in particular to collimate and radiate light in a direction away from the substrate surface, or to couple out light.

47. Pixel according to any one of the preceding items, in which a converter material for light conversion is arranged at least above and/or around one of the optoelectronic components, wherein the converter material can be electrically insulated from the transparent cover electrode in particular by an insulating layer.

48. Display or display module comprising a plurality of pixels according to any one of the preceding items arranged in rows and columns and individually controllable, in which in particular pixels arranged in a row have a common cover layer and a common electrical control contact.

49. Display or display module according to any one of the preceding items, wherein the pixels are separated from each other by a raised area on the substrate.

50. Display or display module according to any one of the preceding items, wherein the substrate comprises a plurality of cavities separated from one another, each of the plurality of pixels being disposed in one of the cavities.

51. Display or display module according to the preceding item, in which a converter material for light conversion, in particular with quantum dots, is incorporated in at least some cavities.

52. Display or display module according to any one of the preceding items, in which
sidewalls of the elevation or the sidewalls between the cavities comprise a reflective layer, especially the mirror coating.

53. Display or display module according to any one of the preceding items, in which the substrate comprise conductive structures, in particular according to any of the preceding or subsequent items, which are configured to address and drive the pixels individually.

54. Illuminating means, in particular in a motor vehicle, comprising a plurality of optoelectronic arrangements or pixels according to any one of the preceding items.

55. Method for manufacturing an optoelectronic component, comprising the steps:
Providing a substrate with a number of contacts on the surface;
attaching at least one, in particular vertical, optoelectronic component to one of the contacts, the optoelectronic component having a further contact on its side facing away from the substrate surface;
providing a reflective layer on the substrate surface that is electrically connected to an electrical control contact on the surface of the substrate and at least partially covers the surface;
forming of a transparent cover electrode on the further contact which electrically contacts the reflective layer.

56. Method according to any one of the preceding items, in which the substrate comprises an elevation that at least partially surrounds the at least one optoelectronic component.

57. Method according to any one of the preceding items, wherein the mirror coating is at least partially applied to sidewalls of the elevation or cavity, in particular those facing the at least one optoelectronic component.

58. Method according to any one of the preceding items, further comprising:
depositing a transparent insulating layer on the substrate surface and surrounding the at least one optoelectronic component; wherein the cover electrode is deposited on the transparent insulating layer.

59. Method according to any one of the preceding items, further comprising at least one of the following steps:
forming an overlapping contact of the cover electrode surface and a mirroring surface in the area of the elevation or at the end of the cavity remote from the at least one optoelectronic component; or
forming a through hole through a transparent insulating layer, and filling the through hole so that the cover electrode contacts the reflective layer thereover; or
applying of a conductive connection on bevelled sides of the transparent insulating layer, which contacts the transparent cover electrode with the reflective layer.

60. Method according to any one of the preceding items, further comprising:
mirroring of a part of the substrate surface between the optoelectronic components, in particular applying of the mirroring layer substrate surface between the optoelectronic components.

61. Method according to any one of the preceding items, further comprising:
forming a patterned layer on the transparent cover electrode having a photonic crystal or quasi-crystal structure and adapted to suppress or reduce light emitted parallel to a surface of the substrate.

62. Method according to any one of the preceding items, further comprising:
structuring of the transparent cover electrode, in particular to collimate light and emit it directed away from the substrate surface, or to couple out light.

63. Method according to any one of the preceding items, further comprising:
applying of a converter material for light conversion over at least one optoelectronic component, the converter material being electrically insulated from the transparent cover electrode in particular by an insulating layer.

64. Optoelectronic component comprising:
a layer stack of a p-doped layer;
an n-doped layer;
an active region located between the p-doped and n-doped layer;
wherein the layer stack rises above a major surface and the active region is located above a centre of the layer stack as viewed from the major surface, wherein the layer stack has a reducing diameter from the major surface;
a reflective layer over a surface of the layer stack.

65. Optoelectronic component according to item 64, in which the stack of layers comprise the shape of a hemisphere or a paraboloid or an ellipsoid.

66. Optoelectronic component according to any one of the preceding items, in which areas of the active layer adjacent to the reflective layer comprise an increased bandgap.

67. Optoelectronic component according to any one of the preceding items, in which areas of the active layer adjacent to the reflective layer exhibit quantum well intermixing.

68. Optoelectronic component according to any one of the preceding items, in which the reflective layer comprises a dielectric between the active region and the layer of the layer stack adjacent to the surface region.

69. Optoelectronic arrangement comprising
a flat carrier substrate; and
at least one optoelectronic component, in particular according to any one of the preceding items, which is arranged on an assembly side of the carrier substrate;
wherein the optoelectronic component is configured to emit light transverse to a carrier substrate plane in a direction away from the carrier substrate;
a flat reflector element;
wherein the reflector element is spatially arranged at the assembly side relative to the at least one optoelectronic component and is configured to reflect light emitted by the at least one optoelectronic component in the direction of the carrier substrate;
wherein the carrier substrate is at least partially transparent so that light reflected from the reflector element propagates through the carrier substrate and emerges on a display side of the carrier substrate opposite the assembly side.

70. Optoelectronic arrangement according to item 69, wherein a diffuser layer is provided for scattering the light reflected from the at least one optoelectronic component on the side of the reflector element directed towards the at least one optoelectronic component and/or a reflector material comprises diffuser particles.

71. Optoelectronic arrangement according to item 70, wherein the diffuser layer and/or the diffuser particles comprise $Al_2O_3$ and/or $TiO_2$.

72. Optoelectronic arrangement according to any one of the preceding items, wherein the reflector element surrounds the at least one optoelectronic component in a circular, polygonal or parabolic shape.

73. Optoelectronic arrangement according to any one of the preceding items, wherein the reflector element forms an electrical contact of the at least one optoelectronic component.

74. Optoelectronic arrangement according to any one of the preceding items, wherein the reflector element is configured and shaped such that at least 90% of the light emitted by the at least one optoelectronic component is incident on the assembly side of the carrier substrate at an angle between 45 and 90 degrees relative to the carrier substrate plane.

75. Optoelectronic arrangement according to any one of the preceding items, wherein the at least one optoelectronic component comprises three components surrounded by the reflector element.

76. Optoelectronic arrangement according to item 75, in which the at least three components have a contact area on the side facing the reflector element, which is covered with a transparent cover layer for common electrical contact.

77. Optoelectronic arrangement according to any one of the preceding items, wherein the carrier substrate comprises polyamide, transparent plastic, resin or glass.

78. Optoelectronic arrangement according to any one of the preceding items, wherein the reflector element is formed as a reflective layer of the at least one optoelectronic component.

79. Optoelectronic arrangement according to any one of the preceding items, wherein a passivation layer is additionally provided for attenuating or eliminating reflections of the light at mesa edges of the at least one optoelectronic component.

80. Optoelectronic arrangement according to any one of the preceding items, wherein a light-absorbing coating is provided on the assembly side and/or the display side of the carrier substrate outside the reflector element.

81. Optoelectronic arrangement according to any one of the preceding items, wherein the display side of the carrier substrate has an uneven and/or roughened structure.

82. Optoelectronic arrangement according to any one of the preceding items, wherein a colour filter element is arranged on the display side of the carrier substrate opposite the reflector element;
wherein the colour filter element allows a primary colour spectrum of the at least one optoelectronic component to pass and attenuates deviating colour spectra.

83. Optoelectronic arrangement according to any one of the preceding items, in which a light-shaping structure, in particular a photonic structure with features according to any one of the following items, is incorporated in the carrier substrate, which comprises first and second regions with different refractive indices.

84. Optoelectronic arrangement according to any one of the preceding items, wherein a light-shaping and/or light-converting structure is arranged on the display side of the carrier substrate, which structure comprises first and second regions.

85. Optoelectronic arrangement according to item 83 or 84, wherein first regions comprise a converter material.

86. Optoelectronic arrangement according to any one of the preceding items, comprising a converter material surrounding the at least one optoelectronic component and filling the space between the optoelectronic component and the reflector material.

87. Optoelectronic component according to any one of the preceding items, comprising a converter material on the display side of the carrier substrate.

88. Display arrangement, in particular video wall, comprising a plurality of optoelectronic arrangements each according to any one of the preceding items.
89. Motor vehicle lighting means with an optoelectronic arrangement according to any one of the preceding items.
90. Method for manufacturing an optical pixel element, comprising the steps of:
   fixing at least one optoelectronic component to an assembly side of a flat carrier substrate;
   creating a reflector element;
wherein the reflector element is formed as a light-reflecting layer on the at least one optoelectronic component, so that light emitted from the at least one optoelectronic component is reflected in the direction of the carrier substrate.

The description with the help of the exemplary embodiments does not limit the various embodiments shown in the examples to these. Rather, the disclosure depicts several aspects, which can be combined with each other and also with each other. Aspects that relate to processes, for example, can thus also be combined with aspects where light extraction is the main focus. This is also made clear by the various objects shown above.

The invention thus comprises any features and also any combination of features, including in particular any combination of features in the subject-matter and claims, even if that feature or combination is not explicitly specified in the exemplary embodiments.

The invention claimed is:
1. Optoelectronic component comprising:
   a layer stack of a p-doped layer;
   an n-doped layer;
   an active region located between the p-doped and n-doped layer;
   wherein the layer stack rises above a major surface and the active region is located above a center of the layer stack as viewed from the major surface, wherein the layer stack has a reducing diameter from the major surface; and
   a reflective layer over a surface of the layer stack;
   in which areas of the active layer adjacent to the reflective layer exhibit quantum well intermixing.
2. Optoelectronic component according to claim 1, in which the stack of layers comprise the shape of a hemisphere or a paraboloid or an ellipsoid.
3. Optoelectronic component according to claim 1, in which areas of the active layer adjacent to the reflective layer comprise an increased bandgap.
4. Optoelectronic component according to claim 1, in which the reflective layer comprises a dielectric between the active region and the layer of the layer stack adjacent to the surface region.
5. Optoelectronic arrangement comprising:
   a flat carrier substrate; and
   at least one optoelectronic component, one optoelectronic component comprising:
      a layer stack of
         a p-doped layer;
         an n-doped layer; and
         an active region located between the p-doped and n-doped layer;
      wherein the layer stack rises above a major surface and the active region is located above a center of the layer stack as viewed from the major surface, wherein the layer stack has a reducing diameter from the major surface;
      wherein the at least one optoelectronic component is arranged on an assembly side of the carrier substrate;
      wherein the optoelectronic component is configured to emit light transverse to a carrier substrate plane in a direction away from the carrier substrate;
   a reflector element;
   wherein the reflector element is spatially arranged at the assembly side relative to the at least one optoelectronic component and is configured to reflect light emitted by the at least one optoelectronic component in the direction of the carrier substrate;
   wherein the carrier substrate is at least partially transparent so that light reflected from the reflector element propagates through the carrier substrate and emerges on a display side of the carrier substrate opposite the assembly side.
6. Optoelectronic arrangement according to claim 5, wherein a diffuser layer is provided for scattering the light reflected from the at least one optoelectronic component on the side of the reflector element directed towards the at least one optoelectronic component and/or a reflector material comprises diffuser particles.
7. Optoelectronic arrangement according to claim 6, wherein the diffuser layer and/or the diffuser particles comprise Al2O3 and/or TiO2.
8. Optoelectronic arrangement according to claim 5, wherein the reflector element surrounds the at least one optoelectronic component in a circular, polygonal or parabolic shape.
9. Optoelectronic arrangement according to claim 5, wherein the reflector element forms an electrical contact of the at least one optoelectronic component.
10. Optoelectronic arrangement according to claim 5, wherein the reflector element is configured and shaped such that at least 90% of the light emitted by the at least one optoelectronic component is incident on the assembly side of the carrier substrate at an angle between 45 and 90 degrees relative to the carrier substrate plane.
11. Optoelectronic arrangement according to claim 5, wherein the at least one optoelectronic component comprises three components surrounded by the reflector element.
12. Optoelectronic arrangement according to claim 11, in which the at least three components have a contact area on the side facing the reflector element, which is covered with a transparent cover layer for common electrical contact.
13. Optoelectronic arrangement according to claim 5, wherein the carrier substrate comprises polyamide, transparent plastic, resin or glass.
14. Optoelectronic arrangement according to claim 5, wherein the reflector element is formed as a reflective layer of the at least one optoelectronic component.
15. Optoelectronic arrangement according to claim 5, wherein a passivation layer is additionally provided for attenuating or eliminating reflections of the light at mesa edges of the at least one optoelectronic component.
16. Optoelectronic arrangement according to claim 5, wherein a light-absorbing coating is provided on the assembly side and/or the display side of the carrier substrate outside the reflector element.
17. Optoelectronic arrangement according to claim 5, wherein the display side of the carrier substrate has an uneven and/or roughened structure.
18. Optoelectronic arrangement according to claim 5, wherein a colour filter element is arranged on the display side of the carrier substrate opposite the reflector element;

wherein the colour filter element allows a primary colour spectrum of the at least one optoelectronic component to pass and attenuates deviating colour spectra.

19. Optoelectronic arrangement according to claim 5, in which a light-shaping structure, in particular a photonic structure with features according to any one of the following items, is incorporated in the carrier substrate, which comprises first and second regions with different refractive indices.

20. Optoelectronic arrangement according to claim 5, wherein a light-shaping and/or light-converting structure is arranged on the display side of the carrier substrate, which structure comprises first and second regions.

21. Optoelectronic arrangement according to claim 20, wherein first regions comprise a converter material.

22. Optoelectronic arrangement according to claim 5, comprising a converter material surrounding the at least one optoelectronic component and filling the space between the optoelectronic component and the reflector material.

23. Optoelectronic arrangement according to claim 5, comprising a converter material on the display side of the carrier substrate.

24. Display arrangement, in particular video wall, comprising a plurality of optoelectronic arrangements each according to claim 5.

25. Motor vehicle lighting means with an optoelectronic arrangement according to claim 5.

* * * * *